US009119002B2

(12) United States Patent
Eastty

(10) Patent No.: US 9,119,002 B2
(45) Date of Patent: Aug. 25, 2015

(54) EQUALIZATION OF AN AUDIO SIGNAL

(75) Inventor: Peter Eastty, Eynsham (GB)

(73) Assignee: OXFORD DIGITAL LIMITED, Oxfordshire (GB)

( * ) Notice: Subject to any disclaimer, the term of this patent is extended or adjusted under 35 U.S.C. 154(b) by 387 days.

(21) Appl. No.: 13/877,784

(22) PCT Filed: Oct. 3, 2011

(86) PCT No.: PCT/GB2011/051875

§ 371 (c)(1),
(2), (4) Date: Apr. 19, 2013

(87) PCT Pub. No.: WO2012/046033

PCT Pub. Date: Apr. 12, 2012

(65) Prior Publication Data

US 2013/0195286 A1 Aug. 1, 2013

(30) Foreign Application Priority Data

Oct. 4, 2010 (GB) .................................. 1016691.6
Feb. 22, 2011 (GB) .................................. 1103066.5

(51) Int. Cl.
*H03G 5/00* (2006.01)
*H04R 1/40* (2006.01)
*H04S 7/00* (2006.01)
*H04R 27/00* (2006.01)

(52) U.S. Cl.
CPC ................ *H04R 1/403* (2013.01); *H04S 7/307* (2013.01); *H04R 27/00* (2013.01); *H04R 2201/401* (2013.01); *H04R 2201/403* (2013.01)

(58) Field of Classification Search
USPC .................. 381/19, 20, 59, 97, 98, 103, 104; 700/94
See application file for complete search history.

(56) References Cited

U.S. PATENT DOCUMENTS 4,500,984 A * 2/1985 Shimbo et al. ................ 370/201
5,043,970 A * 8/1991 Holman .......................... 369/89
5,046,105 A * 9/1991 Bohn .............................. 381/98
5,864,798 A 1/1999 Miseki et al.
2004/0021472 A1 2/2004 Carney
2007/0025559 A1 * 2/2007 Mihelich et al. ................ 381/59

FOREIGN PATENT DOCUMENTS

WO 2009112825 9/2009
WO 2011080499 7/2011

* cited by examiner

*Primary Examiner* — Vivian Chin
*Assistant Examiner* — Friedrich W Fahnert
(74) *Attorney, Agent, or Firm* — Antonio Papageorgiou, Esq.; Meister Seelig & Fein LLP

(57) ABSTRACT

A method of processing an input audio signal, the method comprising forming a plurality of output audio signals from the input audio signal, wherein each output audio signal is formed by performing respective processing on the input audio signal, wherein for a first output audio signal there is a target audio equalization operation comprising a target filter twice, wherein for the first output audio signal, the respective processing comprises a first audio equalization operation, the first audio equalization operation being the target audio equalization operation modified to compensate for phase shifts that correspond to zeros of the transfer function of the target audio equalization operation, wherein for each output audio signal other than the first output audio signal, the respective processing comprises a compensation filter that compensates for phase shifts that correspond to poles of the transfer function of the target audio equalization operation.

13 Claims, 19 Drawing Sheets

EQUALIZATION OF AN AUDIO SIGNAL

FIELD OF THE INVENTION

The present invention relates to methods of processing an input audio signal, methods of determining a configuration for audio equalization of an input audio signal, and apparatus and computer programs therefore.

BACKGROUND OF THE INVENTION

Equalization, or filtering, is used to alter the frequency spectrum of a signal by altering the frequency response of an equalization device through which the signal passes, e.g. by increasing or decreasing the amplitude of the signal over a band of frequencies while leaving the amplitude of the signal at other frequencies largely unchanged. The signal may be a digital audio signal, but it will be appreciated that it may be other types of signal too. The filtering is achieved by processing the input signal such that the output signal from the filter depends upon some constant linear combination of delayed samples of both the input signal and the output signal of the filter. In general the filtering of a signal to produce a desired frequency response has the side effect of also causing a frequency-dependent change in the delay imposed upon the signal. When this delay at a particular frequency is viewed in comparison to the period of that frequency this can be seen as a phase difference.

It is known to construct FIR (finite impulse response) filters of arbitrary frequency response and arbitrary phase response, particularly FIR filters of linear phase, i.e. those that have constant delay regardless of frequency. However FIR filters have disadvantages when used for audio equalization, in that they are very much more complex, more difficult to control and have greater delay than IIR (infinite impulse response) filters.

In general small changes in phase are not audible. However, a problem with phase shift occurs when two versions of the same signal, but with different phases, are combined or added together. When this happens, the frequency-dependent difference in relative phases between the two versions causes undesirable and unintended filtering effects.

For many applications a true linear phase, constant delay filter (which can only be a symmetrical FIR filter) is not what is required. Instead, for many applications the actual requirement is that multiple independently equalized signals be made from a single input signal, and that all output signals have identical phase responses. This is the requirement when the multiple output signals may later be additively combined in an arbitrary manner.

One example application is in the control of "line array" loudspeakers used for public address in large venues. These line arrays use the constructive interference between vertically spaced elements to control their directional properties, thus it is important not to disturb the relative phases of the individual elements in the array. On the other hand it is frequently required that different equalization be applied to different elements of the array which are responsible for delivering sound to different areas of the audience. Typically the top elements in the array deliver sound to the back of the auditorium while the lower elements deliver sound to the front of the audience. The large difference between the distances served by the top of the array and by the bottom of the array means that it is frequently required to apply different equalization to the different elements in order to counteract the high-frequency attenuation of the longer path lengths. Thus the equalization of these arrays requires multiple, different, frequency responses to be imposed on individual outputs without them having different phase responses and all with low delay and low computational complexity.

A second application can occur in loudspeakers designed for domestic sound reproduction. Frequently more than one transducer is present in a single cabinet and this can lead to similar constraints to those mentioned above.

A third application occurs in consumer audio equipment where it is desired to allow the user to alter the frequency response of some element of an audio system using a simple cross-fade control between signals which have been exposed to two extremes of filtering. Typically a signal may be constructed with increased bass response, and another with increased treble response, and a simple selection of a weighted sum of these two signals will be used as the final output with the relative weighting under control of the listener. Such user control can only be achieved in this manner if the two signals are in phase throughout the audio band.

It will be appreciated that other example applications exist that require generating multiple independently equalized signals from a single input signal, where all of these generated signals have identical phase responses.

SUMMARY OF THE INVENTION

According to an aspect of the invention, there is provided a method of processing an input audio signal, the method comprising: forming a plurality of output audio signals from the input audio signal, wherein each output audio signal is formed by performing respective processing on the input audio signal, wherein for a first output audio signal there is a target audio equalization operation comprising a target filter twice; wherein for the first output audio signal, the respective processing comprises a first audio equalization operation, the first audio equalization operation being the target audio equalization operation modified to compensate for phase shifts that correspond to zeros of the transfer function of the target audio equalization operation; wherein for each output audio signal other than the first output audio signal, the respective processing comprises a compensation filter that compensates for phase shifts that correspond to poles of the transfer function of the target audio equalization operation.

According to another aspect of the invention, there is provided a method of determining a configuration for audio equalization of an input audio signal, wherein a plurality of output audio signals are to be formed from the input audio signal by performing respective processing on the input audio signal, wherein for a first output audio signal there is a target audio equalization operation comprising a target filter twice, the method comprising: specifying the target audio equalization operation; setting the respective processing for the first output audio signal to comprise a first audio equalization operation, the first audio equalization operation being the target audio equalization operation modified to compensate for phase shifts that correspond to zeros of the transfer function of the target audio equalization operation; for each output audio signal other than the first output audio signal, setting the respective processing to comprise a compensation filter that compensates for phase shifts that correspond to poles of the transfer function of the target audio equalization operation.

In the above methods, the first audio equalization operation may equal the target audio equalization operation but with one of the target filters replaced by a replacement filter, in which case: (a) the poles of the transfer function of the replacement filter are the same as the poles of the transfer function of the target filter; and (b) the zeros of the transfer function of the replacement filter are reciprocals of the zeros of the transfer function the target filter.

Alternatively, in the above methods, the first audio equalization operation may equal the target audio equalization operation together with an additional filter, in which case: (a) the poles of the transfer function of the additional filter are the same as the zeros of the transfer function of the target filter; and (b) the zeros of the transfer function of the additional filter are reciprocals of the zeros of the transfer function the target filter.

In one embodiment, (a) the poles of the transfer function of the compensation filter are the same as the poles of the transfer function of the target filter; and (b) the zeros of the transfer function of the compensation filter are reciprocals of the poles of the transfer function the target filter.

The above methods may comprise time-aligning the plurality of output audio signals.

According to an aspect of the invention, there is provided an apparatus comprising a processor that is arranged to carry out any one of the above methods.

According to an aspect of the invention, there is provided a computer program which, when executed by a processor, causes the processor to carry out any one of the above methods. The computer program may be carried by a computer-readable medium.

BRIEF DESCRIPTION OF THE DRAWINGS

Embodiments of the invention will now be described, by way of example only, with reference to the accompanying drawings, in which.

DETAILED DESCRIPTION OF EMBODIMENTS OF THE INVENTION

In the description that follows and in the figures, certain embodiments of the invention are described. However, it will be appreciated that the invention is not limited to the embodiments that are described and that some embodiments may not include all of the features that are described below. It will be evident, however, that various modifications and changes may be made herein without departing from the broader spirit and scope of the invention as set forth in the appended claims.

Figure 1:
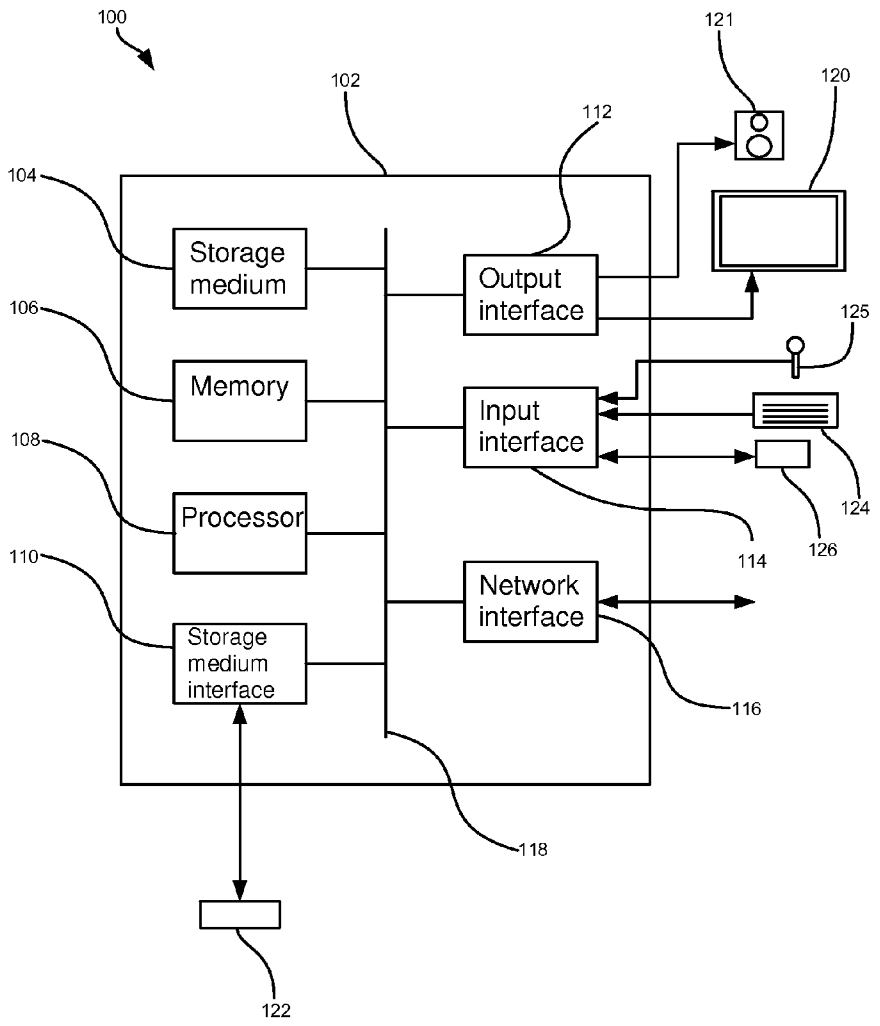
FIG. 1 schematically illustrates an example computer system according to an embodiment of the invention.

Embodiments of the invention may be executed by a computer system. FIG. 1 schematically illustrates an example computer system 100 according to an embodiment of the invention. The system 100 comprises a computer 102. The computer 102 comprises: a storage medium 104, a memory 106, a processor 108, a storage medium interface 110, an output interface 112, an input interface 114 and a network interface 116, which are all linked together over one or more communication buses 118.

The storage medium 104 may be any form of non-volatile data storage device such as one or more of a hard disk drive, a magnetic disc, an optical disc, a ROM, etc. The storage medium 104 may store an operating system for the processor 108 to execute in order for the computer 102 to function. The storage medium 104 may also store one or more computer programs (or software or instructions or code) that form part of an embodiment of the invention.

The memory 106 may be any random access memory (storage unit or volatile storage medium) suitable for storing data and/or computer programs (or software or instructions or code) that form part of an embodiment of the invention.

The processor 108 may be any data processing unit suitable for executing one or more computer programs (such as those stored on the storage medium 104 and/or in the memory 106) which have instructions that, when executed by the processor 108, cause the processor 108 to carry out a method according to an embodiment of the invention and configure the system 100 to be a system according to an embodiment of the invention. The processor 108 may comprise a single data processing unit or multiple data processing units operating in parallel, in cooperation with each other, or independently of each other. The processor 108, in carrying out data processing operations for embodiments of the invention, may store data to and/or read data from the storage medium 104 and/or the memory 106.

The storage medium interface 110 may be any unit for providing an interface to a data storage device 122 external to, or removable from, the computer 102. The data storage device 122 may be, for example, one or more of an optical disc, a magnetic disc, a solid-state-storage device, etc. The storage medium interface 110 may therefore read data from, or write data to, the data storage device 122 in accordance with one or more commands that it receives from the processor 108.

The input interface 114 is arranged to receive one or more inputs to the system 100. For example, the input may comprise input received from a user, or operator, of the system 100; the input may comprise input received from a device external to or forming part of the system 100. A user may provide input via one or more input devices of the system 100, such as a mouse (or other pointing device) 126 and/or a keyboard 124, that are connected to, or in communication with, the input interface 114. However, it will be appreciated that the user may provide input to the computer 102 via one or more additional or alternative input devices. The system may comprise a microphone 125 (or other audio transceiver or audio input device) connected to, or in communication with, the input interface 114, the microphone 125 being capable of providing a signal to the input interface 114 that represents audio data (or an audio signal). The computer 102 may store the input received from the/each input device 124, 125, 126 via the input interface 114 in the memory 106 for the processor 108 to subsequently access and process, or may pass it straight to the processor 108, so that the processor 108 can respond to the input accordingly.

The output interface 112 may be arranged to provide a graphical/visual output to a user, or operator, of the system 100. As such, the processor 108 may be arranged to instruct the output interface 112 to form an image/video signal representing a desired graphical output, and to provide this signal to a monitor (or screen or display unit) 120 of the system 100 that is connected to the output interface 112. Additionally, or alternatively, the output interface 112 may be arranged to provide an audio output to a user, or operator, of the system 100. As such, the processor 108 may be arranged to instruct the output interface 112 to form one or more audio signals representing desired audio output, and to provide this/these signal(s) to one or more speakers 121 of the system 100 that is/are connected to the output interface 112.

Finally, the network interface 116 provides functionality for the computer 102 to download data from and/or upload data to one or more locations accessible via one or more data communication networks (such as the Internet or a local area network).

It will be appreciated that the architecture of the system 100 illustrated in FIG. 1 and described above is merely exemplary and that other computer systems 100 with different architectures and additional and/or alternative components may be used in embodiments of the invention. Not all of the elements of the system 100 need necessarily be present for embodiments of the invention. Some or all of the input devices (e.g. the keyboard 124, the microphone 125 and the mouse 126) and/or the output devices (e.g. the monitor 120 and the speaker 121) may be integral with the computer 102, whilst others may be peripheral devices communicatively coupled to the computer 102 (e.g. via a cable and/or wirelessly).

Figure 2:
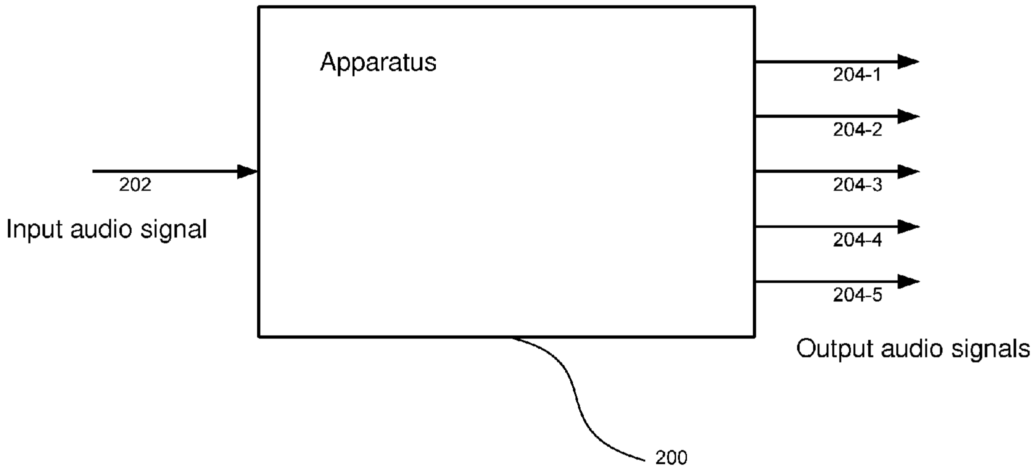
FIG. 2 schematically illustrates a system according to an embodiment of the invention.

FIG. 2 schematically illustrates a system according to an embodiment of the invention. The system comprises an apparatus 200 that is arranged to receive an input audio signal 202 and to process the received input audio signal 202 in order to generate a plurality of output audio signals 204. In FIG. 2, five output audio signals 204-1, 204-2, 204-3, 204-4, 204-5 are illustrated, but it will be appreciated that any number of output audio signals 204 could be generated. Each output audio signal 204 is therefore a processed version of the input audio signal 202. For each output audio signal 204, the apparatus 200 performs respective processing (filtering or equalization) associated with that output audio signal 204 on the input audio signal 202 in order to generate that output signal 204.

The input audio signal 202 may be received from any source and may be in any format that the apparatus 200 can receive (e.g. as an audio signal from one or more microphones, as audio data retrieved from a storage medium, etc.). The output audio signals 204 may be output to one or more respective output devices (such as speakers) and/or may be recorded or stored on one or more recording media. The output audio signals 204 may undergo further processing (such as being additively combined), with these processed output audio signals then being output and/or stored in addition to, or in place of, the initial output audio signals 204.

The apparatus 200 may be a general purpose computer system, such as the computer system 100 illustrated in FIG. 1. In this case, the input audio signal 202 may be received as an audio signal from the microphone 125 or as audio data from the storage medium 104, the memory 106, the data storage device 122 or as audio data or an audio signal received/accessed from a location accessible on a network via the network interface 116 or from any other source. The output audio signals 204 may then be output via one or more of the speakers 121 and/or may be stored as data on the storage medium 104, the memory 106, the data storage device 122 or at a location on a network accessible via the network interface 116. Alternatively, the apparatus 200 may comprise a more bespoke device such as one or more digital signal processors, field-programmable-gate-arrays, or application-specific-integrated-circuits that have been configured to carry out the processing on the input audio signal 202 in order to generate the output audio signals 204.

As a specific example application, the input audio signal 202 may be an audio signal intended to be output via a line array loudspeaker. The apparatus 200 may be used to perform various equalization processing to form respective output audio signals 204 intended for different elements of the line array loudspeaker. The individual output audio signals 204 are then provided to the relevant elements accordingly. As another example, the input audio signal 202 may be intended to be output by a single speaker, whilst allowing a user to control the degree of bass and/or treble and/or mid-range attenuation or amplification. Multiple output signals 204 may be produced, one having bass attenuation or amplification, one having treble attenuation or amplification, one having mid-range attenuation or amplification. These output audio signals may be additively combined (potentially a weighted combination based on weighting controlled by a user), with the resultant audio signal being output to a speaker.

It will be appreciated that other example applications exist in which it is desirable to produce a plurality of output audio signals 204 as versions of, or based on, an input audio signal 202.

In order to actually determine what specific processing the apparatus 200 needs to carry out in order to generate the output audio signals 204 from the input audio signal 202, a configuration for the apparatus 200 may be determined. This may be achieved, for example, by running a computer program on the computer system 100 to determine the configuration, and then configuring the apparatus 200 accordingly. Alternatively, the apparatus 200 may be arranged to determine the configuration itself.

The processing performed by the apparatus 200 is arranged such that each output audio signal 204 is a filtered (or equalized) version of the input audio signal 202. As mentioned above, the processing is arranged such that all of the output audio signals 204 have the same phases responses, i.e. the respective filtering/processing applied to the input audio signal 202 to produce a first one of the output audio signals 204 has the same phase response as the respective filtering/processing applied to the input audio signal 202 to produce a second one of the output audio signals 204. The specific filtering performed by the apparatus 200, and methods of determining this specific filtering performed by the apparatus 200, shall be described in more detail below.

Embodiments of the invention relate to the control of the phases of signals passing through arbitrary IIR equalizers or IIR filters. Embodiments of the invention may be applied to (or involve) an extremely large class of IIR filters. Examples include 'bell' or parametric equalizers, shelving filters, high pass, low pass and band pass filters, notch filters and other classes of audio filters and equalizers, but it will be appreciated that embodiments of the invention may be applied to (or involve) other types of IIR filter. Embodiments of the invention are applicable to both analogue and digital filters (i.e. the apparatus 200 may be implemented using analogue or digital filters). Whilst the following explanation will be given in terms of a digital implementation, the skilled person will appreciate that the techniques described below apply analogously to analogue filters.

Figure 3A:
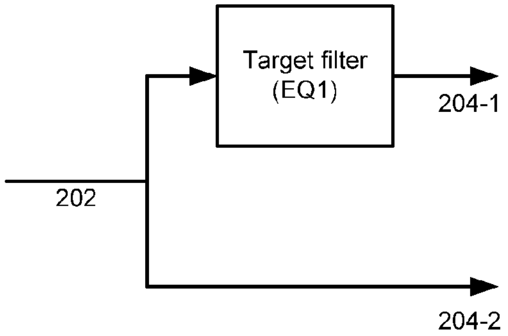
FIG. 3*a* schematically illustrates an initial desired audio processing configuration.

FIG. 3*a* schematically illustrates an initial desired audio processing configuration. The desired configuration illustrated in FIG. 3*a* is the most basic form—more complex forms will be illustrated later. In this desired configuration, the input audio signal 202 is to be used to generate two output audio signals 204-1, 204-2. One of the output audio signals 204-2 is just a copy of the input audio signal 202, i.e. the output audio signal 204-2 has the same frequency spectrum as the input audio signal 202. To generate the other output audio signal 204-1, the input audio signal 202 is to be processed by a target (or initially-specified) filter or equalization EQ1. As mentioned above, the target filter EQ1 may be from any of the above classes of IIR filters.

Figure 3B:
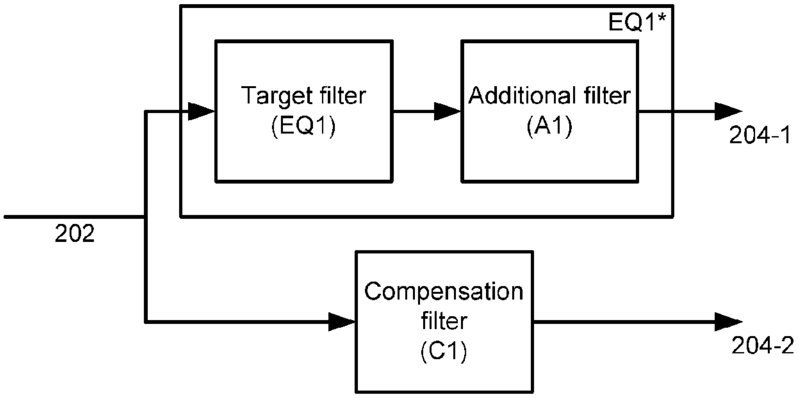
FIGS. 3*b* and 3*c* schematically illustrate example modified target filters and compensation filters corresponding to the configuration of FIG. 3*a;*
Figure 3C:
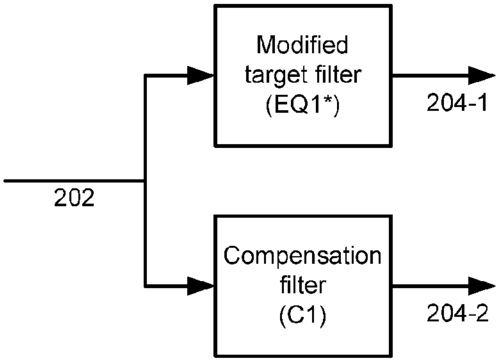

As mentioned above, the equalization achieved by using the target filter EQ1 may impose frequency-dependent phase shifts, so that, without making use of embodiments of the invention, there would be a phase difference between the two output audio signals 204-1, 204-2. To overcome this, embodiments of the invention apply a modified target filter EQ1* instead of the initial target filter EQ1 to generate the output audio signal 204-1 and apply a compensation filter C1 to generate each of the other output audio signals (i.e. the output audio signals 204 other than the one formed using the modified target filter EQ1*), i.e. to generate the output audio signal 204-2. This is illustrated in FIGS. 3*b* and 3*c*. In both of FIGS. 3*b* and 3*c*, the compensation filter C1 is used as part of the processing to generate the output audio signal 204-2. In FIG. 3*b*, the modified target filter EQ1* is achieved by a series combination of the initial target filter EQ1 and an additional filter A1 (which shall be described in more detail later). In FIG. 3*c*, the modified target filter EQ1* is achieved by modifying the initial target filter EQ1 (which again shall be described in more detail later)—i.e. the initial target filter EQ1 is not itself used.

As shall be described shortly, the modified target filter EQ1* is equivalent to the target filter EQ1 modified to compensate for phase shifts that correspond to zeros of the transfer function of the target filter EQ1—here, by "modified", we mean modified by virtue of cascading the initial target filter EQ1 with an additional filter (as in FIG. 3*b*) or by actually modifying the initial target filter EQ1 itself (as in FIG. 3*c*). As the skilled person will understand, a zero of the transfer function of the target filter EQ1 induces a corresponding phase response or phase shift on the output audio signal 204-1. Therefore, the modified target filter EQ1* compensates for (or removes or cancels out or undoes or avoids) the phase responses induced by or caused by the various zeros of the transfer function of the target filter EQ1. As the skilled person will also understand, a pole of the transfer function of the target filter EQ1 induces a corresponding phase response or phase shift on the output audio signal 204-1. In a similar way then, the compensation filter C1 is designed to compensate for phase shifts that correspond to poles of the transfer function of the target filter EQ1, i.e. to induce on the other output audio signals 204-2 the same phase response as that induced on the output audio signal 204-1 by the poles of the transfer function of the target filter EQ1.

In embodiments of the invention, the compensation filter C1 is an all-pass filter, so that it does not affect the frequency spectrum of the output audio signal 204-2. Similarly, the modified target filter EQ1* has the same frequency response as the target filter EQ1. In this way, the desired frequency responses for the two output audio signals 204-1, 204-2 are both what was initially desired. The use of the modified target filter EQ1* and the compensation filter C1 ensure that the two output audio signals 204-1, 204-2 are phase-aligned, i.e. have identical phase responses.

The use of a compensation filter C1 and a modified target filter EQ1* as illustrated in FIGS. 3*b* and 3*c* for the basic scenario of FIG. 3*a* can be used as a basic building block when more output audio signals 204 are to be produced and/or when more respective target filters EQ1, EQ2, . . . are to be applied to generate the various output audio signals 204. This is described below.

Figure 4A:
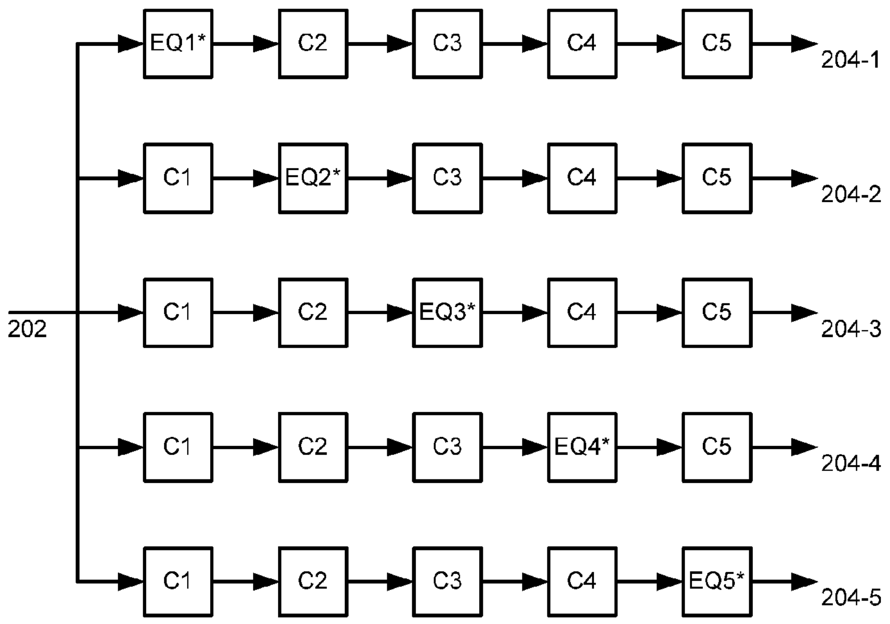
FIG. 4*a* is an example arrangement of an embodiment of the invention in which five output audio signals are generated from an input audio signal.

FIG. 4*a* is an example arrangement of an embodiment of the invention in which five output audio signals 204-1 . . . 204-5 are generated from an input audio signal 202. For each of the output audio signals 204-1 . . . 204-5, there is a respective target audio equalization or filter EQ1 . . . EQ5. If the output audio signals 204-1 . . . 204-5 were to be generated simply by applying their respective target filters EQ1 . . . EQ5 to the input audio signal 202, then the output audio signals 204-1 . . . 204-5 would not necessarily be phase-aligned (i.e. they would have different phase responses). To avoid this, in the embodiment shown in FIG. 4*a*, each output audio signal 204-*n* (n=1 . . . 5) is generated by applying to the input audio signal 202 (a) a respective modified target filter EQn* (which is a modified form of the initial target filter EQn associated with that output audio signal 204-*n*) and (b) compensation filters corresponding to the target audio filters for the other output audio signals, i.e. compensation filters C1 . . . C5 other than Cn. For example, the output audio signal 204-3 is generated by applying to the input audio signal 202 (a) a modified target filter EQ3* (which is a modified version of the initial target filter EQ3 for the output audio signal 204-3) and (b) compensation filters C1, C2, C4 and C5 which correspond to the initial target filters EQ1, EQ2, EQ4 and EQ5 for the other output audio signals 204-1, 204-2, 204-4 and 204-5.

The modified target filter EQn* may be a modified version of the initial target filter EQn within the meaning described above with reference to FIG. 3*b* or within the meaning described above with reference to FIG. 3*c*.

It will be appreciated that the modified target audio filters and compensation filters that form the processing for a particular output audio signal 204 may be applied in any order, and that the ordering shown in FIG. 4*a* is merely an example for ease of illustration.

It will be appreciated that whilst FIG. 4*a* relates to a scenario involving five output audio signals 204, embodiments of the invention may involve any other number of output audio signals 204 in the same way. In this way, this processing can be performed so that arbitrary equalization may be applied to an input audio signal 202 to generate any number of output audio signals 204 without changing the phase relationship between them, i.e. whilst maintaining the same phase response across all of the output audio signals 204 so that they are phase-aligned.

Figure 4B:
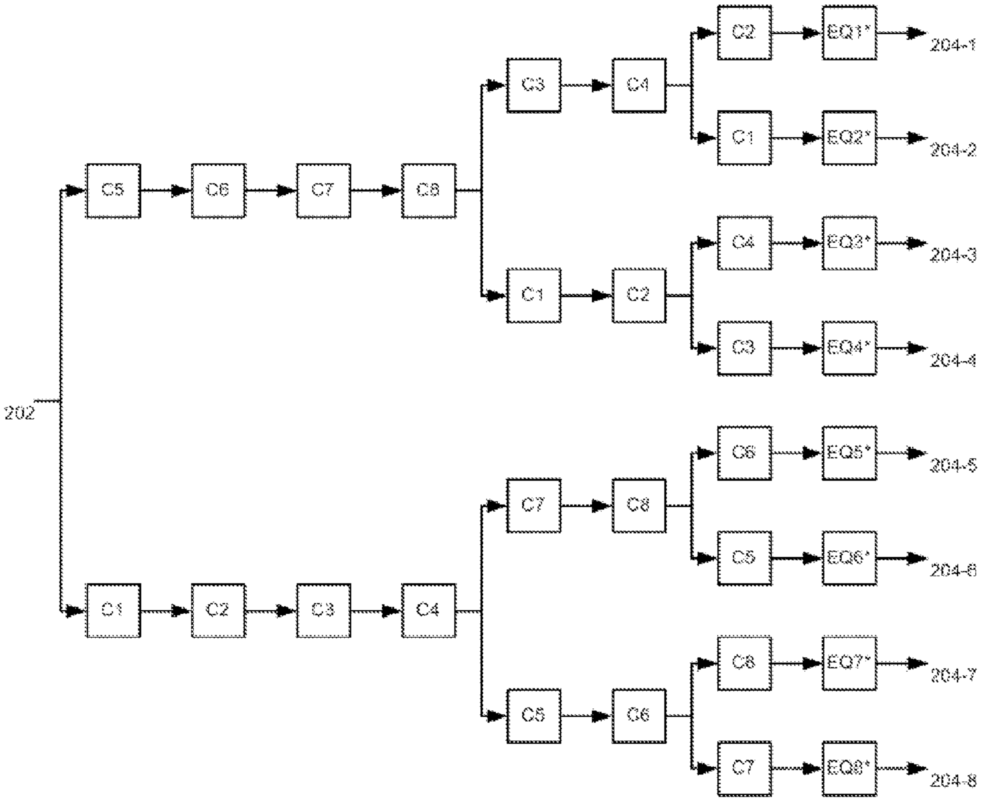
FIG. 4*b* is an example arrangement of an embodiment of the invention in which eight output audio signals are generated from an input audio signal.

FIG. 4*b* is an example arrangement of an embodiment of the invention in which eight output audio signals 204-1 . . . 204-8 are generated from an input audio signal 202. The same processing as explained above with reference to FIG. 4*a* applies to the example illustrated in FIG. 4*b*. However, the arrangement illustrated in FIG. 4*b* provides for more efficient resource utilization (in terms of the number of filters and processing required). The complexity of the arrangement of FIG. 4*b* is N log N of compensation filters (where N is the number of output audio signals), which is acceptable.

Therefore, the processing to be applied to the input audio signal 202 to generate the n-th output audio signal 204-*n* involves the modified target filter EQn* and the compensation filters corresponding to the other target audio filters, namely C1, . . . , C*n*−1, Cn+1, . . . , CN. It will be appreciated that, depending on how the various modified target filters EQn* and compensation filters Cn are actually implemented in practice, the processing for one output audio signal 204 may take a different computation/processing time from the processing for another output audio signal 204. Thus, embodiments of the invention may be arranged to time-align the plurality of output audio signals, e.g. by introducing one or more delays into the processing for certain output audio signals 204 to ensure that the computation/processing time is the same for all of the output audio signals 204.

Figure 5A:
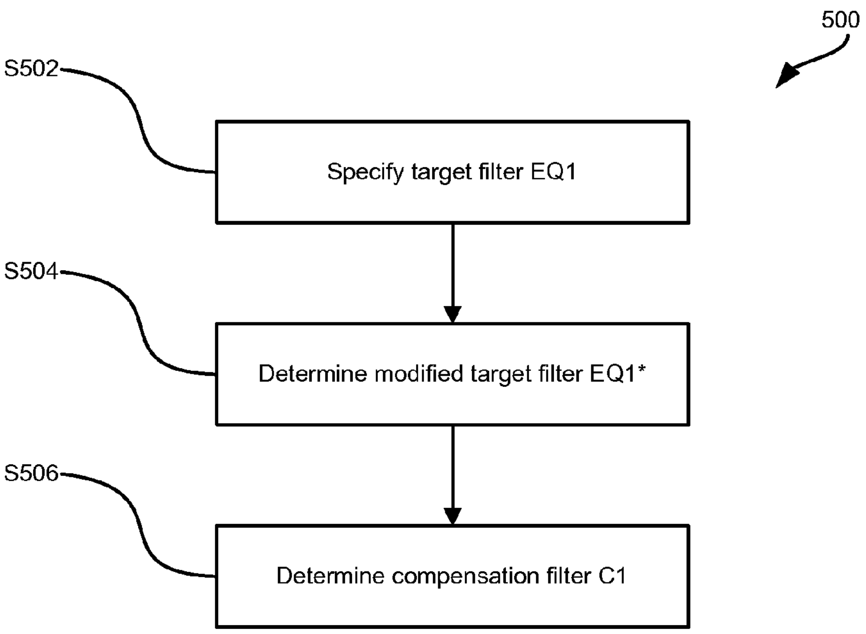
FIGS. 5*a* and 6*a* are flowcharts schematically illustrating methods of determining a configuration for audio equalization of an input audio signal, according to embodiments of the invention.

FIG. 5*a* is a flowchart schematically illustrating a method 500 of determining a configuration (e.g. for the apparatus 200) for audio equalization of an input audio signal 202, where a plurality of output audio signals 204 are to be formed from the input audio signal 202 by performing respective processing on the input audio signal 202. As illustrated in FIG. 3*a*, for a first output audio signal 204-1 there is a target audio equalization operation EQ1. The method 500 may be carried out by the system 100 (for example by the processor 108 executing a computer program, potentially under the control of a user).

At a step S502, the method 500 comprises specifying the target audio equalization operation EQ1. There are numerous ways of specifying a target filter EQ1. One example method comprises specifying the transfer function of the target filter EQ1 (or, equivalently, identifying the poles and zeros of the transfer function of the target audio filter). An alternative method comprises specifying how an output audio sample is generated as a linear combination of previous output audio samples y[n] and input audio samples x[n], i.e. when the target audio filter generates an output audio sample as $$y[n] = \sum_{j=1}^{\infty} s_j y[n-j] + \sum_{j=0}^{\infty} t_j x[n-j]$$

then the step S502 may involve specifying the coefficients $s_j$ and $t_j$. The skilled person will appreciated that, no matter how the target filter EQ1 is initially specified, the transfer function of the target filter EQ1 may be determined and, in particular, the zeros and poles of the transfer function of the target filter EQ1 may be determined.

At a step S504, the modified target filter EQ1* is determined. Thus, the respective processing to produce the first output audio signal 204-1 from the input audio signal 202 is set to comprise a first audio equalization operation EQ1*, the first audio equalization operation EQ1* being the target audio equalization operation EQ1 modified to compensate for phase shifts that correspond to zeros of the transfer function of the target equalization operation EQ1. This shall be described in more detail shortly.

At a step S506, the compensation filter C1 is determined. Thus, for each output audio signal 204 other than the first output audio signal 204-1, the respective processing to produce that output audio signal 204 from the input audio signal 202 is set to comprise the compensation filter C1 that compensates for phase shifts that correspond to poles of the transfer function of the target equalization operation EQ1. This shall be described in more detail shortly.

Figure 5B:
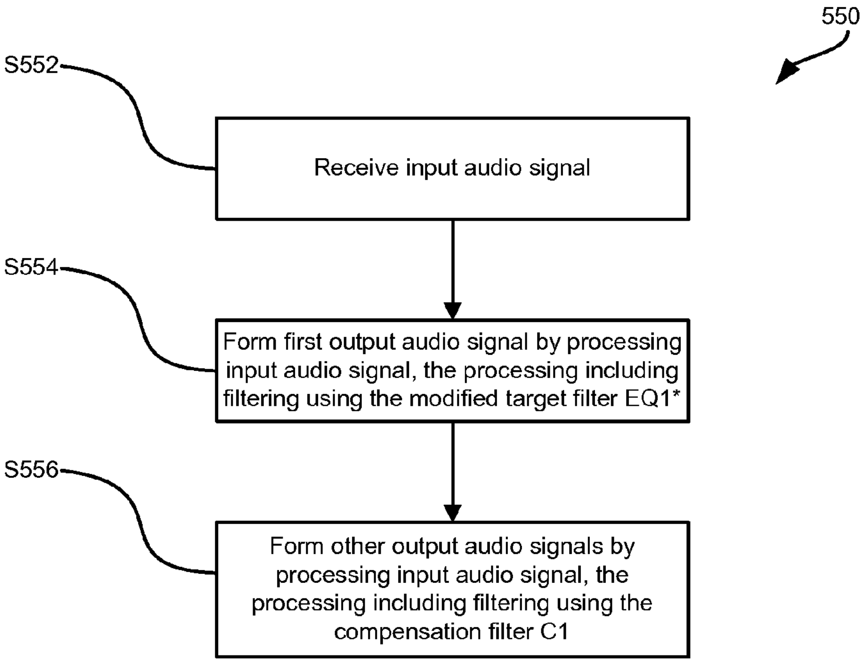
FIGS. 5*b* and 6*b* are flowcharts schematically illustrating methods of processing an input audio signal according to embodiments of the invention.

FIG. 5*b* is a flowchart schematically illustrating a method 550 of processing (e.g. by the apparatus 200) an input audio signal 202. The processing of the input audio signal 202 comprises forming a plurality of output audio signals 204 from the input audio signal 202, wherein each output audio signal 204 is formed by performing respective processing on the input audio signal 202. As illustrated in FIG. 3*a*, for a first output audio signal 204-1 there is a target audio equalization operation EQ1.

At a step S552, the input audio signal 202 is received (as has been described above).

For the first output audio signal 204-1, the respective processing to produce the first output audio signal 204-1 from the input audio signal 202 comprises a first audio equalization operation EQ1*, the first audio equalization operation EQ1* being the target audio equalization operation EQ1 modified to compensate for phase shifts that correspond to zeros of the transfer function of the target equalization operation EQ1. Thus, at a step S554, the method 550 involves processing the input audio signal 202 to form the first output audio signal 204-1, the processing including filtering using the modified target filter EQ1*.

For each output audio signal 204 other than the first output audio signal 204-1, the respective processing to produce that output audio signal from the input audio signal 202 comprises a compensation filter C1 that compensates for phase shifts that correspond to poles of the transfer function of the target equalization operation EQ1. Thus, at a step S556, the method 550 involves processing the input audio signal 202 to form the output audio signals 204 (other than the first output audio signal 204-1), the processing including filtering using the compensation filter C1.

Figure 6A:
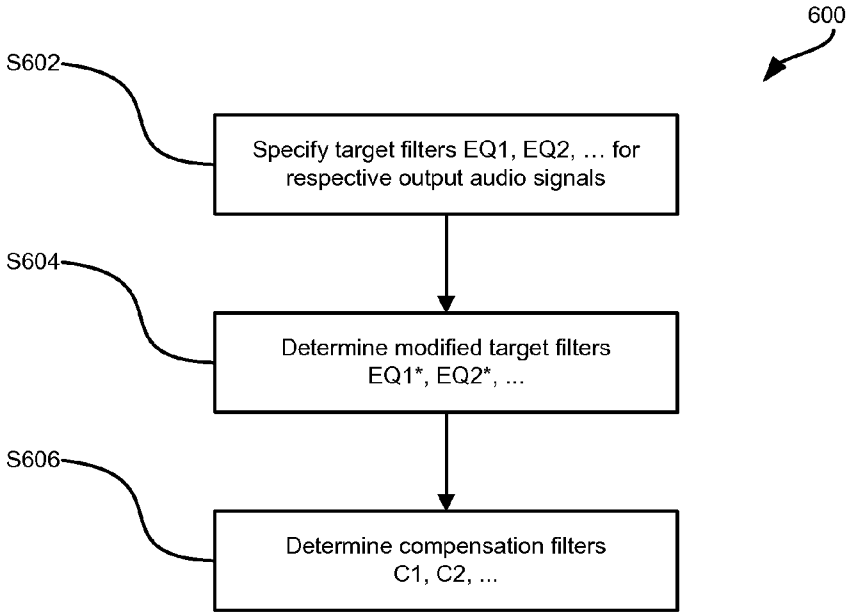

FIG. 6*a* is a flowchart schematically illustrating a method 600 of determining a configuration (e.g. for the apparatus 200) for audio equalization of an input audio signal 202, where a plurality of output audio signals 204 are to be formed from the input audio signal 202 by performing respective processing on the input audio signal 202. As illustrated in FIGS. 4*a* and 4*b*, for each output audio signal 204-1, . . . , 204-N there is a respective target audio equalization operation EQ1, . . . , EQN. The method 600 may be carried out by the system 100 (for example by the processor 108 executing a computer program, potentially under the control of a user).

At a step S602, the method comprises specifying the target audio equalization operations EQ1, . . . , EQN. This may be performed for each target audio equalization operation EQ1, . . . , EQN as described above for the step S502.

At a step S604, modified target filters EQ1*, . . . , EQN* are determined, corresponding to the specified target audio equalization operations EQ1, . . . , EQN. Thus, the respective processing for each output audio signal 204-*n* is set to comprise a respective first audio equalization operation EQn*, the first audio equalization operation EQn* being the target audio equalization operation EQn modified to compensate for phase shifts that correspond to zeros of the transfer function of the target equalization operation EQn. This shall be described in more detail shortly.

At a step S606, compensation filters C1, . . . , CN are determined, corresponding to the specified target audio equalization operations EQ1, . . . , EQN. Thus, for each output audio signal 204-*n*, the respective processing is set to also comprise the compensation filters C1, . . . , Cn−1, Cn+1, . . . , CN corresponding to the other output audio signals 204, where each of these compensation filters C1, . . . , Cn−1, Cn+1, . . . , CN compensates for phase shifts that correspond to poles of the transfer function of the respective target equalization operation EQ1, . . . , EQn−1, EQn+1, . . . , EQN. This shall be described in more detail shortly.

Figure 6B:
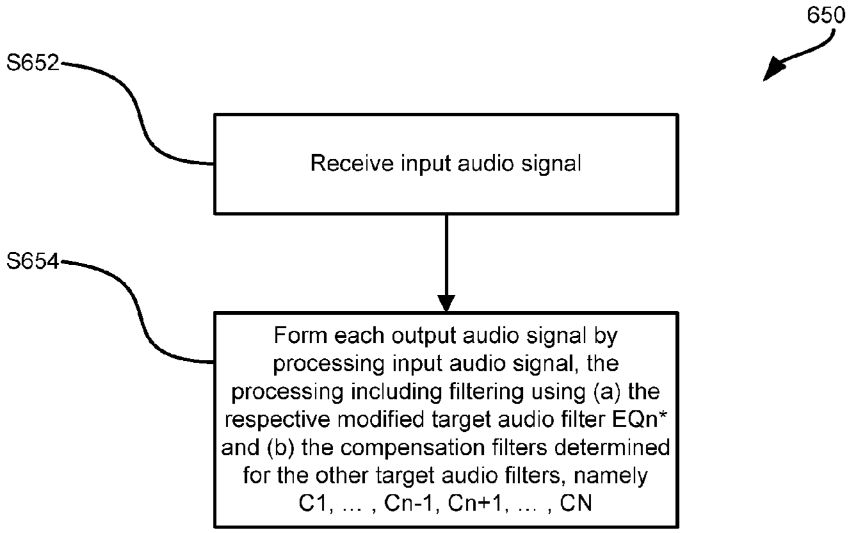

FIG. 6*b* is a flowchart schematically illustrating a method 650 of processing (e.g. by the apparatus 200) an input audio signal 202. The processing of the input audio signal 202 comprises forming a plurality of output audio signals 204-1, . . . , 204-N from the input audio signal 202, wherein each output audio signal is formed by performing respective processing on the input audio signal 202. As illustrated in FIGS. 4*a* and 4*b*, for each output audio signal 204-1, . . . , 204-N there is a respective target audio equalization operation EQ1, . . . , EQN.

At a step S652, the input audio signal 202 is received (as has been described above).

For each output audio signal 204-*n*, the respective processing comprises a respective first audio equalization operation EQn*, the first audio equalization operation EQn* being the target audio equalization operation EQn modified to compensate for phase shifts that correspond to zeros of the transfer function of the target equalization operation EQn. Moreover, for each output audio signal 204-*n*, the respective processing comprises the compensation filters C1, . . . , Cn−1, Cn+1, . . . , CN corresponding to the other output audio signals 204, where each of these compensation filters C1, . . . , Cn−1, Cn+1, . . . , CN compensates for phase shifts that correspond to poles of the transfer function of the respective target equalization operation EQ1, . . . , EQn−1, EQn+1, . . . , EQN. Thus, at a step S654, the method 650 involves processing the input audio signal 202 to form the output audio signals 204, the processing including filtering using the modified target filter and compensation filters, as set out above.

The methods 600 and 650 described above with reference to FIGS. 6*a* and 6*b* are therefore extended versions of the methods 500 and 550 described above with reference to FIGS. 5*a* and 5*b*, extended in the sense of more than one output audio signal 204 having a corresponding target audio filter specified.

The following description shall now describe how, given an initially-specified target filter EQ1, the corresponding modified target filter EQ1* and compensation filter C1 may be determined. The same applies to any of the other initially specified target filters EQ1, EQ2, . . . , EQN.

Preferably, the initially-specified/target filter EQ1 (specified at the step S502, S602) is a filter that can be expressed as a cascade (or series) of two identical filters of any type. This restriction is not onerous, as the skilled person will appreciate that any filter that is designed to give XdB of gain or loss at a particular frequency can be approximated or represented by a cascade of two similar filters, each designed to give a gain or loss of ½XdB at that particular frequency. This can easily be done for any of the types of IIR filter listed above, and others. Thus, if when specifying the initial target filter EQ1 the specification is not in the form of a cascade of two identical filters, then the processing at the step S502 or S602 involves re-specifying the target filter EQ1 as a cascade of two identical filters. If, for a particular initial target filter EQ1, it is not possible to represent that initial target filter EQ1 exactly as a cascade of two identical filters, then the initial target filter EQ1 can be approximated by a cascade of two identical filters instead. For example, there are known systems (such as those described in GB2458631 and UK application 0922702.6) that are able to construct/define a filter that approximates a specified frequency response—therefore, such a system can be used to construct a filter that approximates a frequency response that is half of the frequency response of the initial target filter EQ1, and this constructed filter can be cascaded with itself to approximate the frequency response of the initial target filter EQ1. This method may be applied more generally, whether or not the initial target filter EQ1 can be expressed exactly as a cascade of two identical filters, as this provides a good way of identifying suitable filters for the cascade.

The following description will therefore assume that the target filter EQ1 is a cascade of two identical base filters B (i.e. the filtering achieved by the target filter EQ1 is the same as that achieved by filtering using the base filter B and then filtering again using the base filter B).

As is well-known, all filters of arbitrary order can be expressed as series combinations of simpler filters being either first or second order structures. The following description will therefore describe how to determine the modified target filter EQ1* and compensation filter C1 when the base filter B is a first order structure and when the base filter B is a second order structure. When the base filter B is of an order higher than 2, the base filter B may be expressed as a cascade of first and/or second order filters, and the methods described below may then be applied to those first and/or second order filters.

Turning first to the example in which the target filter EQ1 is a single, repeated, second order section. i.e. a fourth order section composed of two identical second order sections B.

Figure 7A:
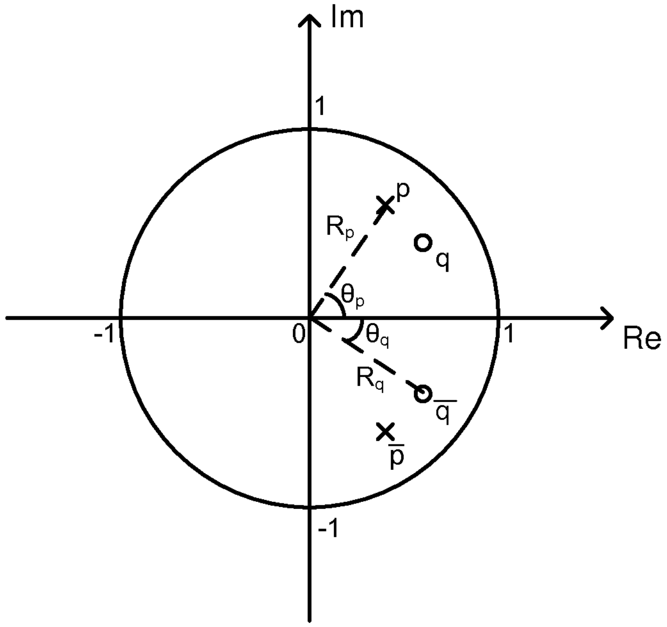
FIGS. 7*a*-7*g* are pole/zero diagrams illustrating the generation of a modified target filter and a compensation filter for a target filter that is a repeated second order filter section.

A typical second order section B has two complex conjugate poles and two complex conjugate zeros. Note that, in this description, when we say that a filter or filter section has poles and zeros, we mean that the transfer function of the filter or filter section has poles and zeros. Thus, for a second order section B, the transfer function $H_B(z)$ has two complex conjugate zeros (q and $\overline{q}$) and two complex conjugate poles (p and $\overline{p}$), i.e.

$$H_B(z) = \frac{a(z-q)(z-\overline{q})}{(z-p)(z-\overline{p})}$$

for some constant a. FIG. 7*a* is a pole/zero diagram for such a second order section. In FIG. 7*a*, the unit circle is shown as well as two small circles representing the zero positions and two small crosses representing the pole positions of the single second order section, or “biquad”, B. The poles are $p=R_p e^{i\theta_p}$ and $\overline{p}=R_p e^{-i\theta_p}$, i.e. they have a modulus of $R_p$ and arguments of $\theta_p$ and $-\theta_p$ respectively. The zeros are $q=R_q e^{i\theta_q}$ and $\overline{q}=R_q e^{-i\theta_q}$, i.e. they have a modulus of $R_q$ and arguments of $\theta_q$ and $-\theta_q$ respectively.

Figure 7B:
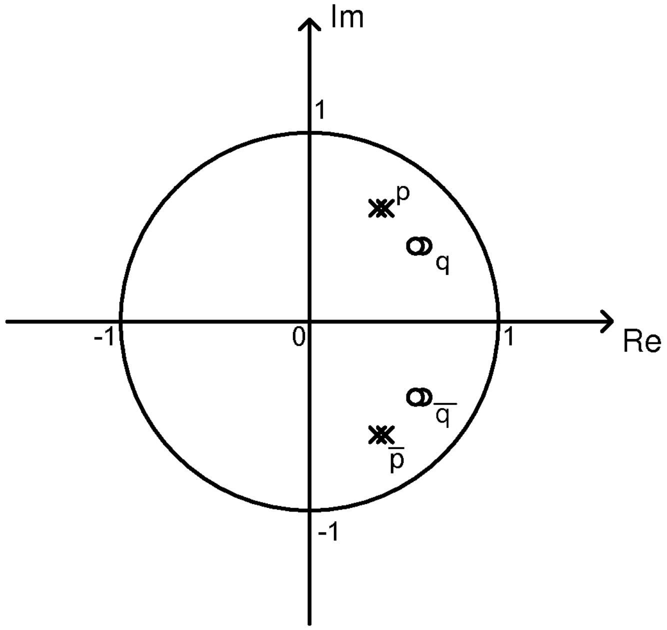

FIG. 7*b* is a pole/zero diagram for the fourth order structure produced by a cascade of two identical second order sections B, i.e. a pole/zero diagram for the current example target filter EQ1. Although the poles and zeros of the second biquad are shown as being laterally displaced from those of first biquad, this is purely for the purposes of illustration and they should be seen as representing identical biquads where the poles and zeros of the first and second biquads are in fact co-located. FIG. 7*b* therefore represents the fourth order structure of the required equalization EQ1, i.e. the structure of the specified equalization path.

Figure 7C:
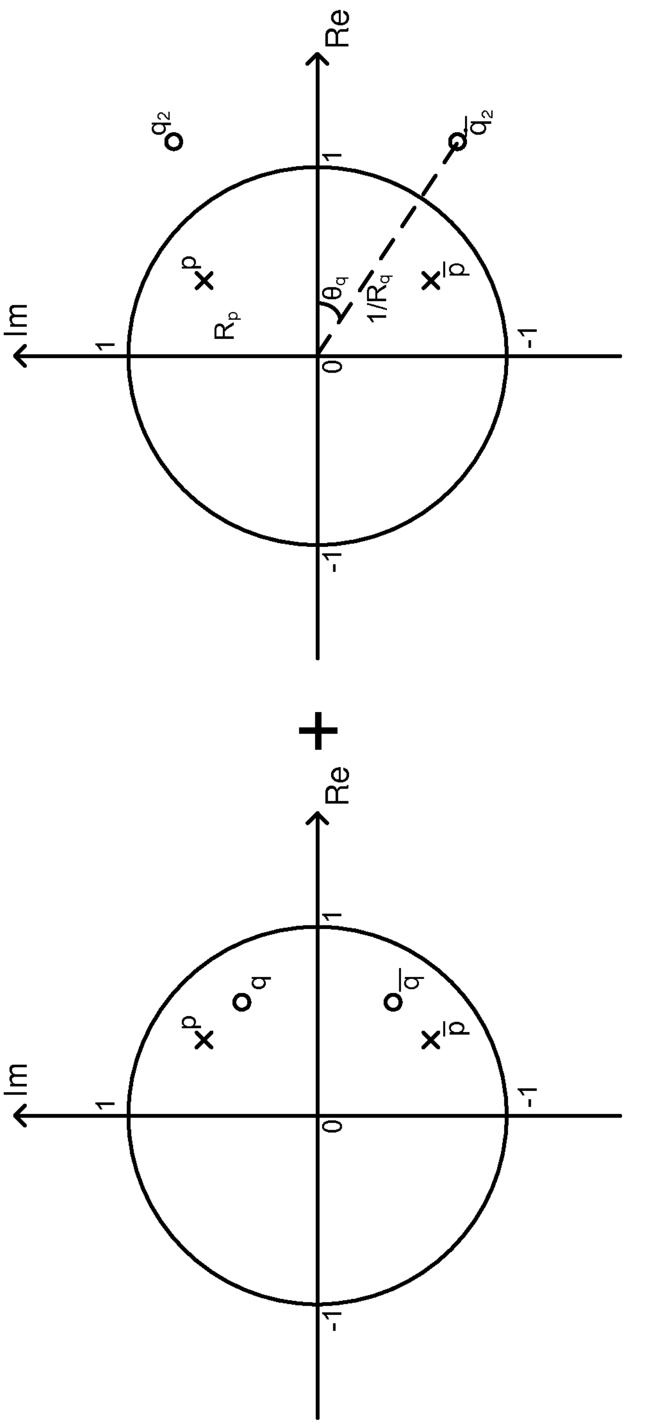

FIG. 7*c* is a pole/zero diagram for the modified target filter EQ1* corresponding to the target filter EQ1 illustrated in FIG. 7*b*. The modified target filter EQ1* comprises two biquads. One of these biquads is the original biquad B (i.e. the same biquad specified in the original filter design as shown in FIG. 7*a*). Thus, the left pole/zero diagram in FIG. 7*c* is the same as the pole/zero diagram shown in FIG. 7*a*. The other biquad is designed based on the original biquad B, but with the positions of the zeros $q_2$ and $\overline{q}_2$ changed to be outside of the unit circle. The zeros have the same argument (angle) $\theta_q$ and $-\theta_q$ respectively as those of the original biquad, but are at a distance from the origin which is the reciprocal (one over) their original distance, i.e. their modulus is $1/R_q$. Thus, $$q_2 = \frac{1}{R_q} e^{i\theta_q} \text{ and } \overline{q}_2 = \frac{1}{R_q} e^{-i\theta_q}.$$

Thus the zeros $q_2$ and $\bar{q}_2$ are reciprocals, respectively, of the initial zeros $\bar{q}$ and q. The modified target filter EQ1* can therefore be formed by modifying or transforming the originally specified target filter EQ1 by moving one complex conjugate pair of zeros from their original positions q and $\bar{q}$ to new positions $q_2$ and $\bar{q}_2$. Thus, whilst the transfer function of the originally specified target filter EQ1 is $$H_{EQ1}(z) = \frac{a^2(z-q)(z-\bar{q})(z-q)(z-\bar{q})}{(z-p)(z-\bar{p})(z-p)(z-\bar{p})},$$

the transfer function of the modified target filter EQ1* is $$H_{EQ1^*}(z) = \frac{a^2(z-q)(z-\bar{q})(z-q_2)(z-\bar{q}_2)}{(z-p)(z-\bar{p})(z-p)(z-\bar{p})}.$$

This is the form of modification illustrated in FIG. 3*c*.

Figure 7D:
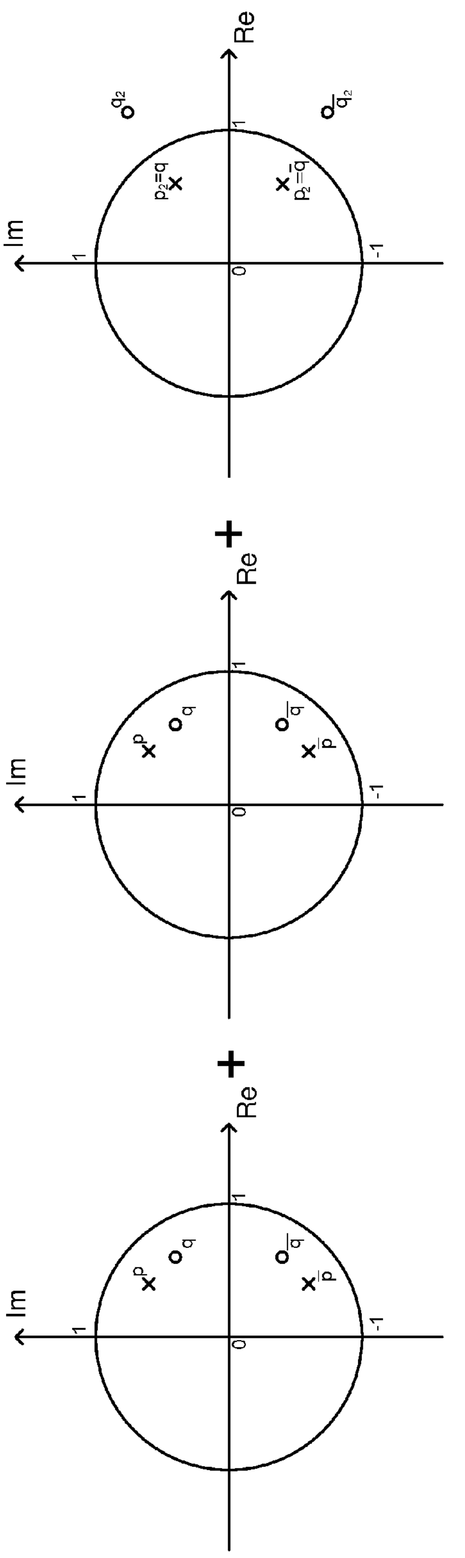

FIG. 7*d* is an alternative pole/zero diagram for the modified target filter EQ1* corresponding to the target filter EQ1 illustrated in FIG. 7*b*. The modified target filter EQ1* comprises three biquads. The first two of these biquads are both the original biquad B (i.e. the same biquad specified in the original filter design as shown in FIG. 7*a*). Thus, the left and middle pole/zero diagrams in FIG. 7*d* are the same as the pole/zero diagram shown in FIG. 7*a* and therefore are (together) equivalent to the target filter EQ1. The other biquad (on the right in FIG. 7*d*) is designed based on the original biquad B, but with (a) the positions of the zeros $q_2$ and $\bar{q}_2$ changed to be outside of the unit circle and (b) the positions of the poles $p_2$ and $\bar{p}_2$ changed to be at the location of the original zeros q and $\bar{q}$. The zeros have the same argument $\theta_q$ and $-\theta_q$ respectively as those of the original biquad, but are at a distance from the origin which is the reciprocal (one over) their original distance, i.e. their modulus is $1/R_q$. Thus, $$q_2 = \frac{1}{R_q}e^{i\theta_q} \text{ and } \bar{q}_2 = \frac{1}{R_q}e^{-i\theta_q}.$$

Thus the zeros $q_2$ and $\bar{q}_2$ are reciprocals, respectively, of the initial zeros $\bar{q}$ and q. The poles are $p_2=R_qe^{i\theta_q}$ and $\bar{p}_2=R_qe^{-i\theta_q}$. The modified target filter EQ1* can therefore be formed by modifying or transforming the originally specified target filter EQ1 by adding an additional biquad (with poles at $p_2$ and $\bar{p}_2$ and zeros at $q_2$ and $\bar{q}_2$). Thus, whilst the transfer function of the originally specified target filter EQ1 is $$H_{EQ1}(z) = \frac{a^2(z-q)(z-\bar{q})(z-q)(z-\bar{q})}{(z-p)(z-\bar{p})(z-p)(z-\bar{p})},$$

the transfer function of the modified target filter EQ1* is $$H_{EQ1^*}(z) = \frac{a^2(z-q)(z-\bar{q})(z-q)(z-\bar{q})(z-q_2)(z-\bar{q}_2)}{(z-p)(z-\bar{p})(z-p)(z-\bar{p})(z-p_2)(z-\bar{p}_2)}.$$

This is the form of modification illustrated in FIG. 3*b*—here, the additional filter A1 of FIG. 3*b* is the biquad represented by the pole/zero diagram on the right in FIG. 7*d*.

The modifications shown in FIGS. 7*c* and 7*d* effectively result in the same modified target filter EQ1*—the combination of the zero/pole diagrams illustrated in FIG. 7*c* is equivalent to the combination of the zero/pole diagrams illustrated in FIG. 7*d*—they are just two different approaches or representations for the modified target filter EQ1*. It will be appreciated that the modified target filter EQ1* could be implemented using other combinations of filter structures that achieve the same final transfer function.

The relative pole and zero positions of the additional filter A1 in FIG. 7*d* (i.e. of the right-most zero/pole diagram in FIG. 7*d*) are known to generate an all-pass response, i.e. one delivering a flat amplitude response. Hence, the frequency response of the modified target filter EQ1* is the same as that of the originally specified target filter EQ1.

Figure 7E:
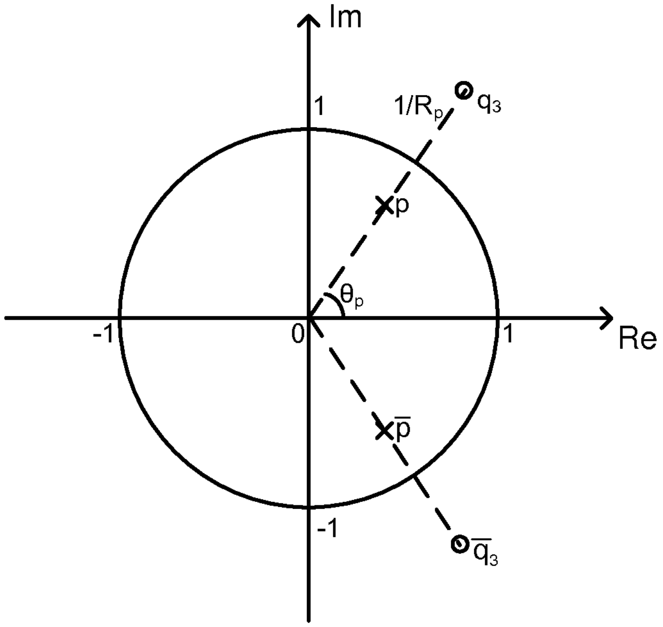

FIG. 7*e* is a pole/zero diagram for the compensation filter/section C1 corresponding to the target filter EQ1 illustrated in FIG. 7*b*. The poles of the compensation section C1 are at the same positions as the poles of either of the equalization sections, i.e. of the biquad B. The zeros $q_3$ and $\bar{q}_3$ of the compensation section C1 are at the reciprocal distance from the poles in a similar manner to that used to generate the zeros of the second equalization section in FIG. 7*c*. In particular, the zeros have the same argument $\theta_p$ and $-\theta_p$ respectively as the poles of the original biquad B and are at a distance from the origin which is the reciprocal of the modulus of the original poles, i.e. their modulus is $1/R_p$. Thus, $$q_3 = \frac{1}{R_p}e^{i\theta_p} \text{ and } \bar{q}_3 = \frac{1}{R_p}e^{-i\theta_p}.$$

Thus the zeros $q_3$ and $\bar{q}_3$ are reciprocals, respectively, of the initial poles $\bar{p}$ and p. Thus the compensation filter C1 is a biquad that has poles at p and $\bar{p}$ and that has zeros at $q_3$ and $\bar{q}_3$. These relative pole and zero positions are known to generate an all-pass response, i.e. one delivering a flat amplitude response—hence, the use of the compensation filter C1 does not affect the frequency response of the processing for the output audio signals to which the compensation filter C1 is to be applied.

Figure 7F:
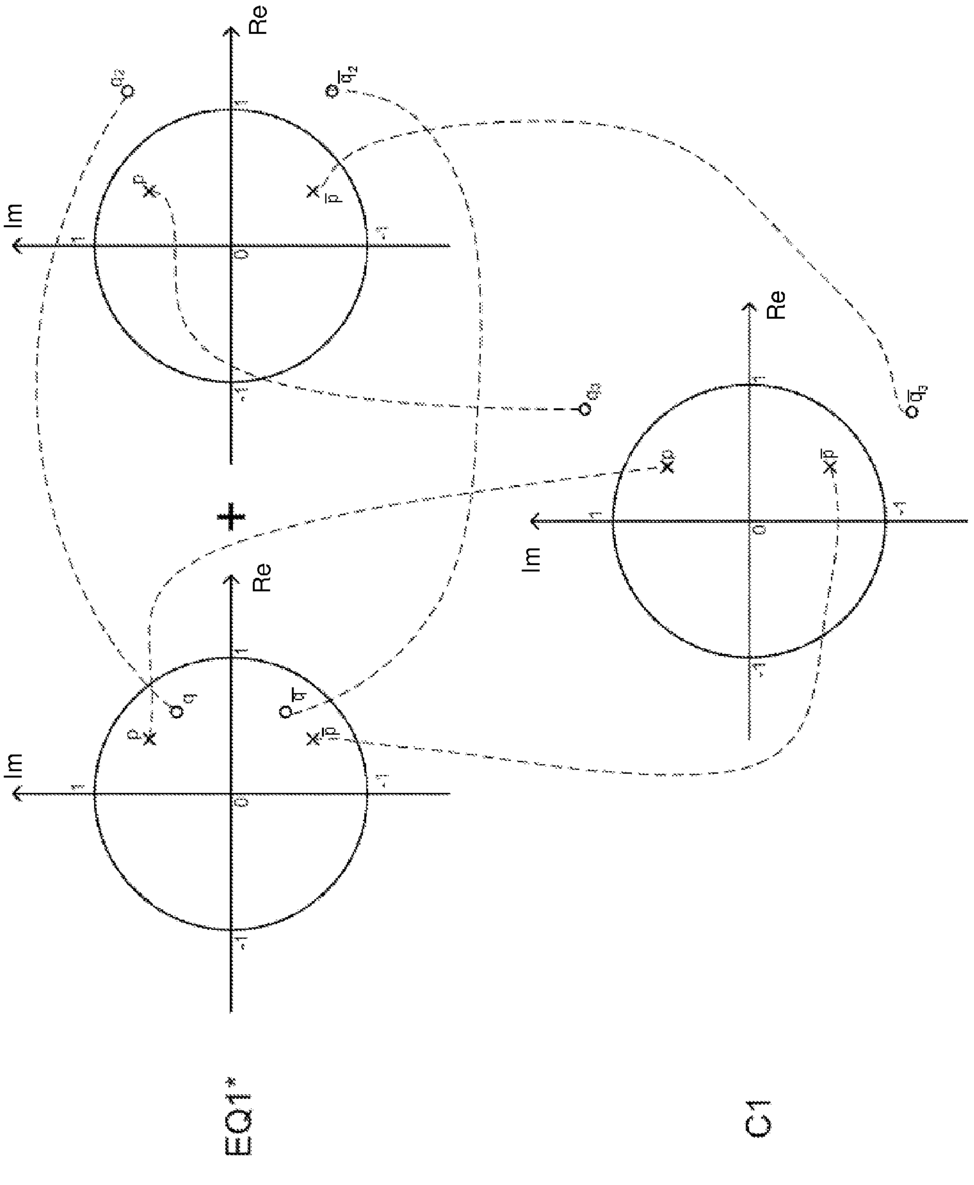

FIG. 7*f* illustrates the pole/zero diagrams of the modified target filter EQ1* of FIG. 7*c* together with the compensation filter C1. Considering the zeros of the two sections of the modified target filter EQ1*, the frequency-dependent phase response of the zeros inside the unit circle (i.e. the zeros at q and $\bar{q}$) cancels the frequency-dependent phase response of the zeros outside the unit circle (i.e. the zeros at $q_2$ and $\bar{q}_2$), leaving only a constant delay of two samples. The poles of the biquad of the compensation filter C1 are the same as the poles of one of the biquads of the modified target filter EQ1*, and so generate the same phase response as the poles of that biquad of the modified target filter EQ1*; the zeros $q_3$ and $\bar{q}_3$ of the biquad of the compensation filter C1, being in the reciprocal position to the poles, generate the same phase response as the poles of the other biquad of the modified target filter EQ1*. Thus, both the equalization path (i.e. the use of the modified target filter EQ1*) and the compensation path (i.e. the use of the compensation filter C1) induce the same phase response. These relationships are shown in FIG. 7*f* by dashed lines.

Figure 7G:
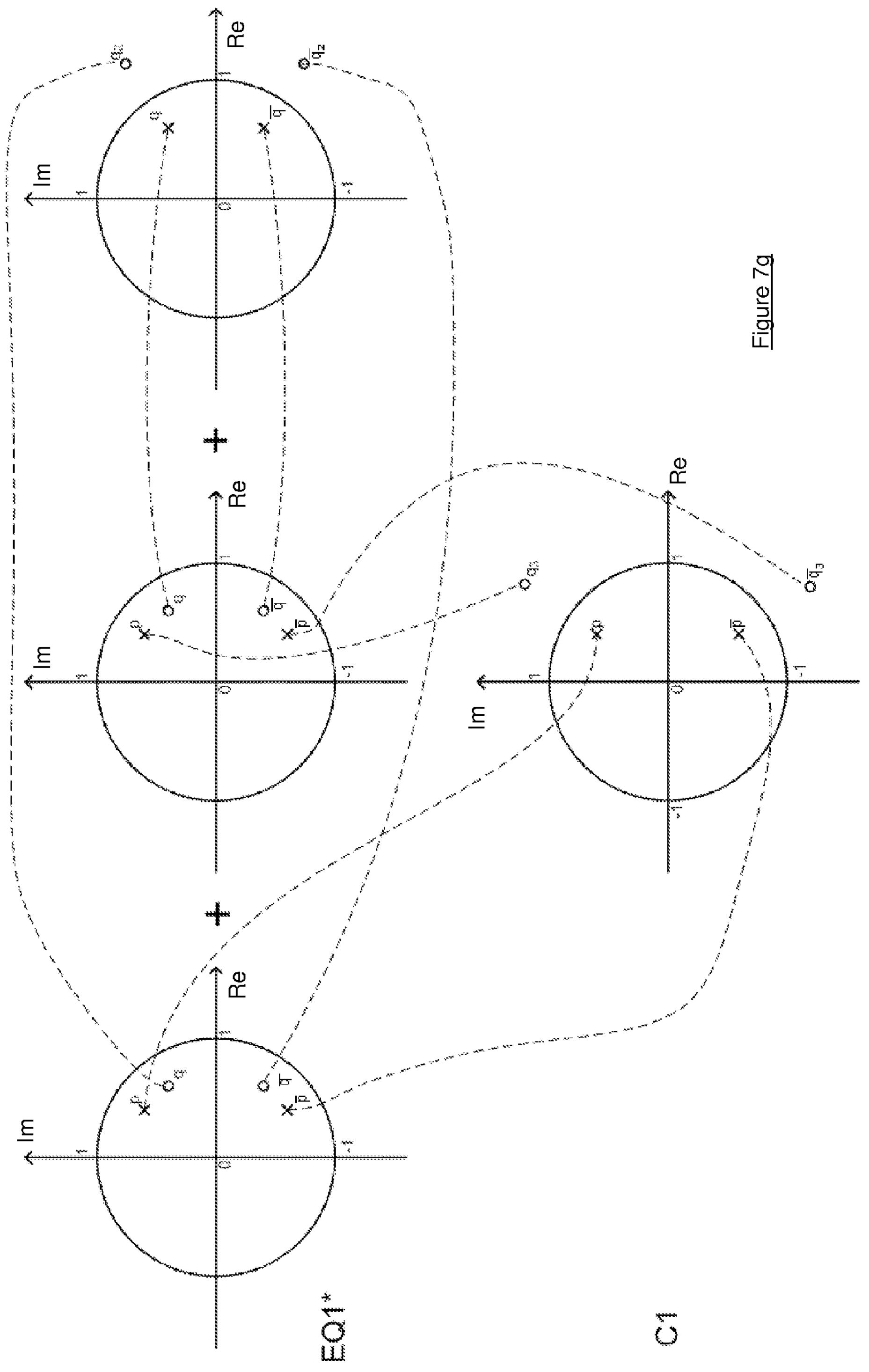

FIG. 7*g* illustrates the pole/zero diagrams of the modified target filter EQ1* of FIG. 7*d* together with the compensation filter C1. For the modified target filter EQ1*: the frequency-dependent phase response of one of the complex conjugate pairs of the zeros inside the unit circle (i.e. one of the pairs of the zeros at q and $\bar{q}$) cancels the frequency-dependent phase response of the zeros outside the unit circle (i.e. the zeros at $q_2$ and $\overline{q}_2$); the frequency-dependent phase response of the other complex conjugate pair of the zeros inside the unit circle (i.e. the other pair of zeros at q and $\overline{q}$) cancels the frequency-dependent phase response of the poles inside the unit circle at the same place (i.e. the poles zeros at $p_2=q$ and $\overline{p}_2=\overline{q}$). The poles of the biquad of the compensation filter C1 are the same as the poles p and $\overline{p}$ of the left biquad of the modified target filter EQ1*, and so generate the same phase response as the poles of that biquad of the modified target filter EQ1*; the zeros $q_3$ and $\overline{q}_3$ of the biquad of the compensation filter C1, being in the reciprocal position to the poles, generate the same phase response as the poles p and $\overline{p}$ of the middle biquad of the modified target filter EQ1*. Thus, both the equalization path (i.e. the use of the modified target filter EQ1*) and the compensation path (i.e. the use of the compensation filter C1) induce the same phase response. These relationships are shown in FIG. 7*g* by dashed lines.

The above example determination of the modified target filter EQ1* from the initial target filter EQ1 applies analogously when the poles and/or zeros are real-valued (instead of being complex-conjugate pairs), namely new poles and/or zeros are derived from existing poles and/or zeros in the same way (via reciprocals, etc. as has been described above).

A pole or a zero located at the origin has no effect on the signal (either in phase or amplitude) and can therefore be ignored—i.e. none of the above reciprocal calculations/modifications need be performed in respect of such a pole or zero of the target filter EQ1.

Turning, then, to the example in which the target filter EQ1 is a single, repeated, first order section. i.e. a second order section composed of two identical first order sections B.

Figure 8A:
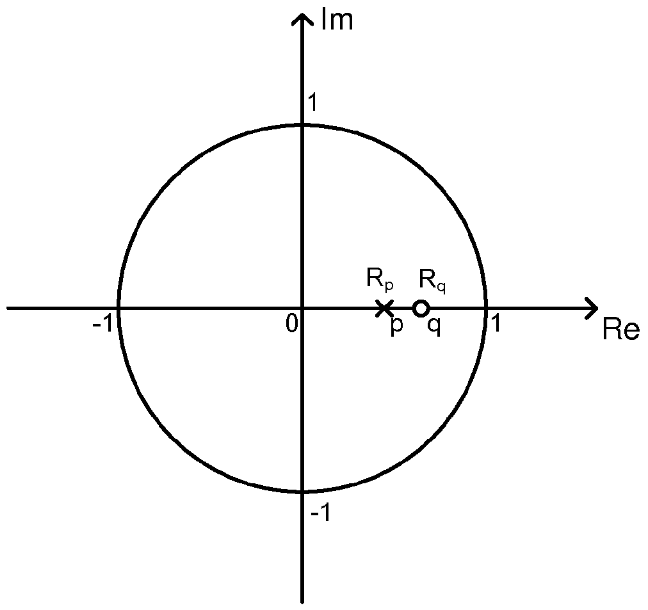
FIGS. 8*a*-8*g* are pole/zero diagrams illustrating the generation of a modified target filter and a compensation filter for a target filter that is a repeated first order filter section.

A typical first order section B has a real pole and a real zero. Thus, for a first order section B, the transfer function $H_B(z)$ has a real zero (q) and a real pole (p), i.e.

$$H_B(z) = \frac{a(z-q)}{(z-p)}$$

for some constant a. FIG. 8*a* is a pole/zero diagram for such a first order section. In FIG. 8*a*, the unit circle is shown as well as a small circle representing the zero position and a small cross representing the pole position of the single first order section, B. The pole p has value $p=R_p$; the zero q has value $q=R_q$.

Figure 8B:
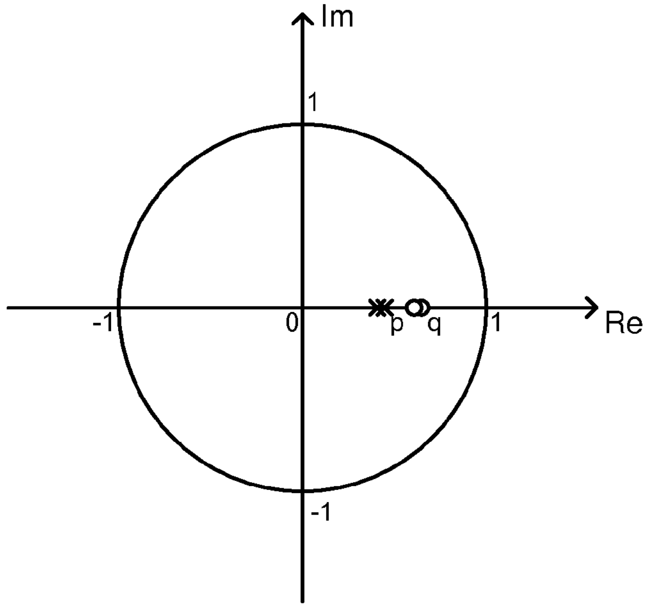

FIG. 8*b* is a pole/zero diagram for the second order structure produced by a cascade of two identical first order sections B, i.e. a pole/zero diagram for the current example target filter EQ1. Although the pole and zero of the second first order section are shown as being laterally displaced from those of first first order section, this is purely for the purposes of illustration and they should be seen as representing identical first order sections where the poles and zeros of the first and second first order sections are in fact co-located. FIG. 8*b* therefore represents the second order structure of the required equalization EQ1, i.e. the structure of the required equalization path.

Figure 8C:
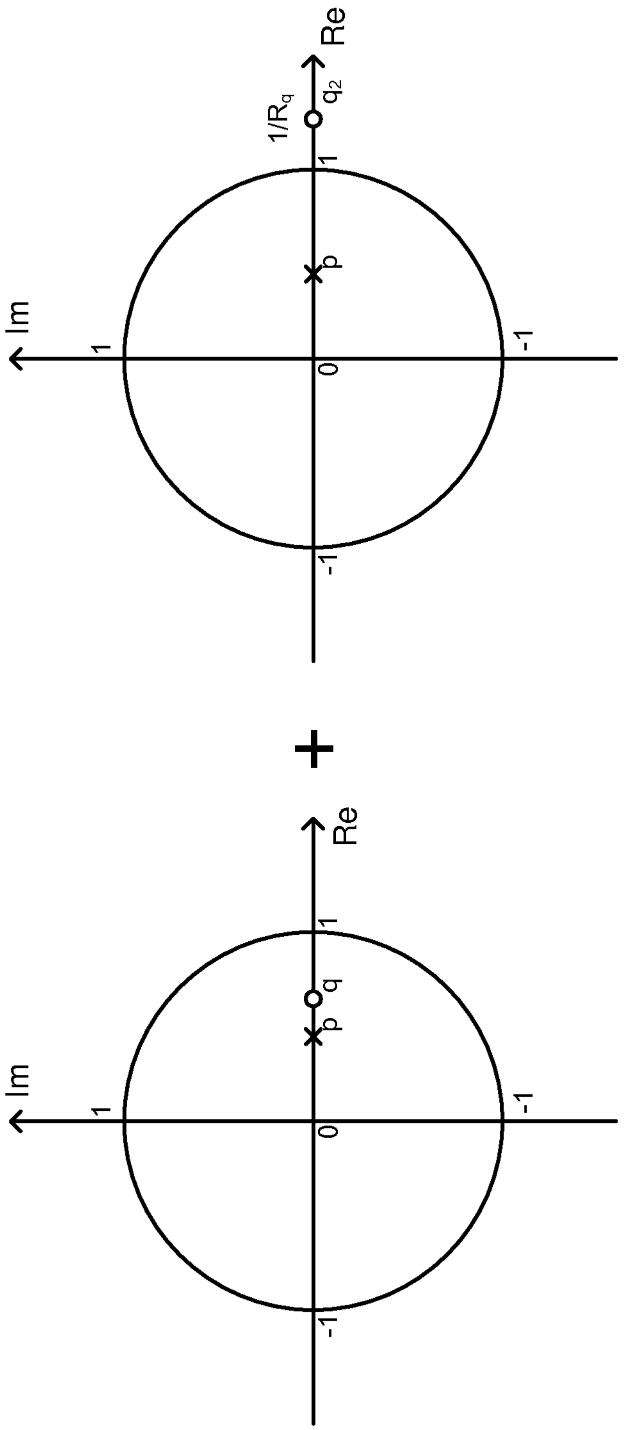

FIG. 8*c* is a pole/zero diagram for the modified target filter EQ1* corresponding to the target filter EQ1 illustrated in FIG. 8*b*. The modified target filter EQ1* comprises two first order sections. One of these first order sections is the original first order section B (i.e. the same first order section specified in the original filter design as shown in FIG. 8*a*). Thus, the left pole/zero diagram in FIG. 8*c* is the same as the pole/zero diagram shown in FIG. 8*a*. The other first order section is designed based on the original first order section B, but with the position of the zero q changed to be outside of the unit circle. The new zero, $q_2$ is at a distance from the origin which is the reciprocal (one over) the original distance, $q_2=1/R_q$. The modified target filter EQ1* can therefore be formed by modifying or transforming the originally specified target filter EQ1 by moving one zeros from its original position q to the new position $q_2$. Thus, whilst the transfer function of the originally specified target filter EQ1 is $$H_{EQ1}(z) = \frac{a^2(z-q)(z-q)}{(z-p)(z-p)},$$

the transfer function of the modified target filter EQ1* is $$H_{EQ1^*}(z) = \frac{a^2(z-q)(z-q_2)}{(z-p)(z-p)}.$$

This is the form of modification illustrated in FIG. 3*c*.

Figure 8D:
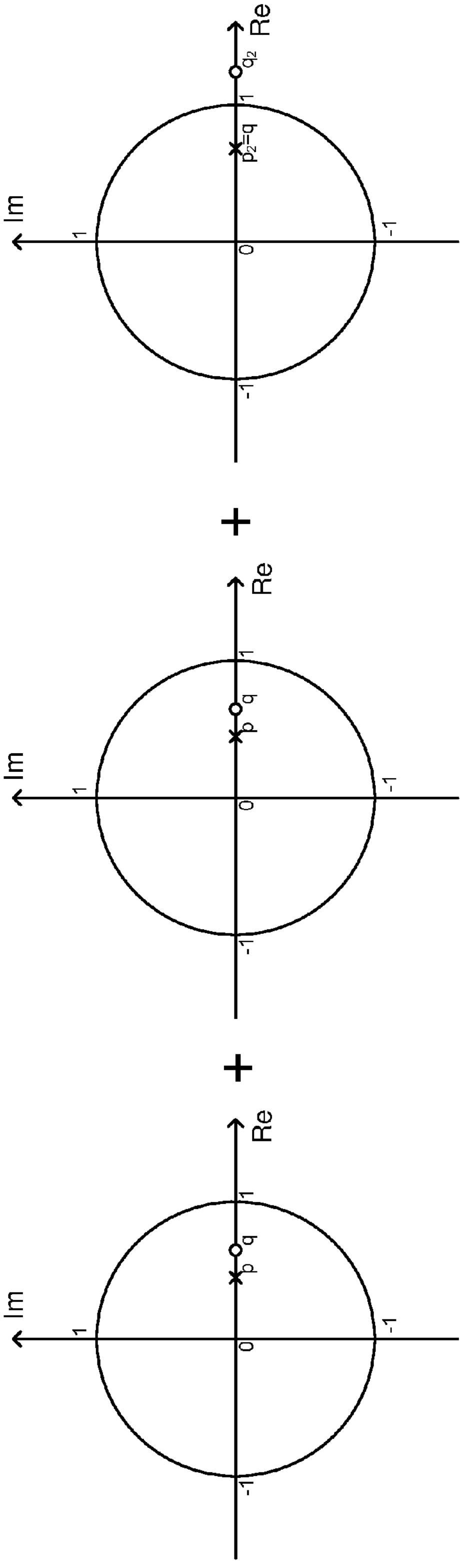

FIG. 8*d* is an alternative pole/zero diagram for the modified target filter EQ1* corresponding to the target filter EQ1 illustrated in FIG. 8*b*. The modified target filter EQ1* comprises three first order sections. The first two of these first order sections are both the original first order section B (i.e. the same first order section specified in the original filter design as shown in FIG. 8*a*). Thus, the left and middle pole/zero diagrams in FIG. 8*d* are the same as the pole/zero diagram shown in FIG. 8*a* and therefore are (together) equivalent to the target filter EQ1. The other first order section (on the right in FIG. 8*d*) is designed based on the original first order section B, but with (a) the position of the zero $q_2$ changed to be outside of the unit circle and (b) the position of the pole $p_2$ changed to be at the location of the original zero q. The zero $q_2$ is at a distance from the origin which is the reciprocal of the original zero distance, i.e. $q_2=1/R_q$ and $p_2=R_q$. The modified target filter EQ1* can therefore be formed by modifying or transforming the originally specified target filter EQ1 by adding an additional first order section (with a pole at $p_2$ and a zero at $q_2$). Thus, whilst the transfer function of the originally specified target filter EQ1 is $$H_{EQ1}(z) = \frac{a^2(z-q)(z-q)}{(z-p)(z-p)},$$

the transfer function of the modified target filter EQ1* is $$H_{EQ1^*}(z) = \frac{a^2(z-q)(z-q)(z-q_2)}{(z-p)(z-p)(z-p_2)}.$$

This is the form of modification illustrated in FIG. 3*b*—here, the additional filter A1 of FIG. 3*b* is the first order section represented by the pole/zero diagram on the right in FIG. 8*d*.

The modifications shown in FIGS. 8*c* and 8*d* effectively result in the same modified target filter EQ1*—the combination of the zero/pole diagrams illustrated in FIG. 8*c* is equivalent to the combination of the zero/pole diagrams illustrated in FIG. 8*d*—they are just two different approaches or representations for the modified target filter EQ1*. It will be appreciated that the modified target filter EQ1* could be implemented using other combinations of filter structures that achieve the same final transfer function.

The relative pole and zero positions of the additional filter A1 in FIG. 8*d* (i.e. of the right-most zero/pole diagram in FIG. 8*d*) are known to generate an all-pass response, i.e. one delivering a flat amplitude response. Hence, the frequency response of the modified target filter EQ1* is the same as that of the originally specified target filter EQ1.

Figure 8E:
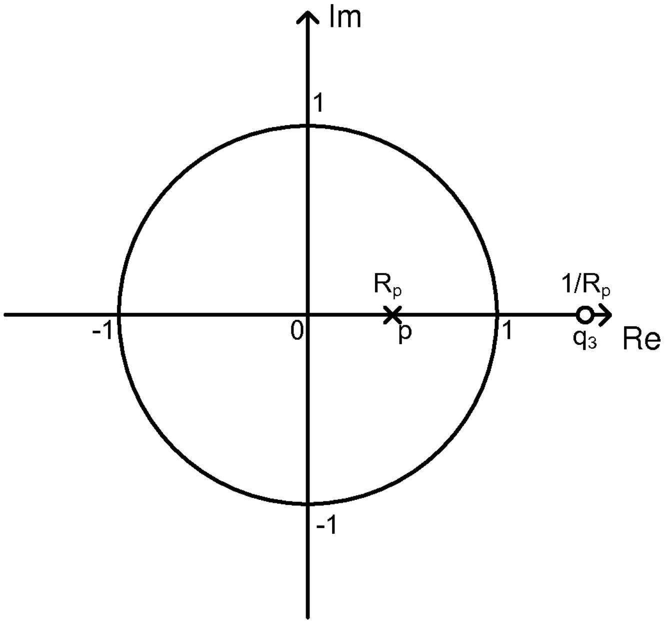

FIG. 8*e* is a pole/zero diagram for the compensation filter/section C1 corresponding to the target filter EQ1 illustrated in FIG. 8*b*. The pole of the compensation section C1 is at the same position as the pole of either of the equalization sections. The zero $q_3$ of the compensation section is at the reciprocal distance from the pole in a similar manner to that used to generate the zero of the second equalization section in FIG. 8*c*. In particular, the zero $q_3=1/R_p$. Thus the compensation filter C1 is a first order section that has a pole at p and that has a zero at $q_3$. These relative pole and zero positions are known to generate an all-pass response, i.e. one delivering a flat amplitude response—hence, the use of the compensation filter C1 does not affect the frequency response of the processing for the output audio signals to which the compensation filter C1 is to be applied.

Figure 8F:
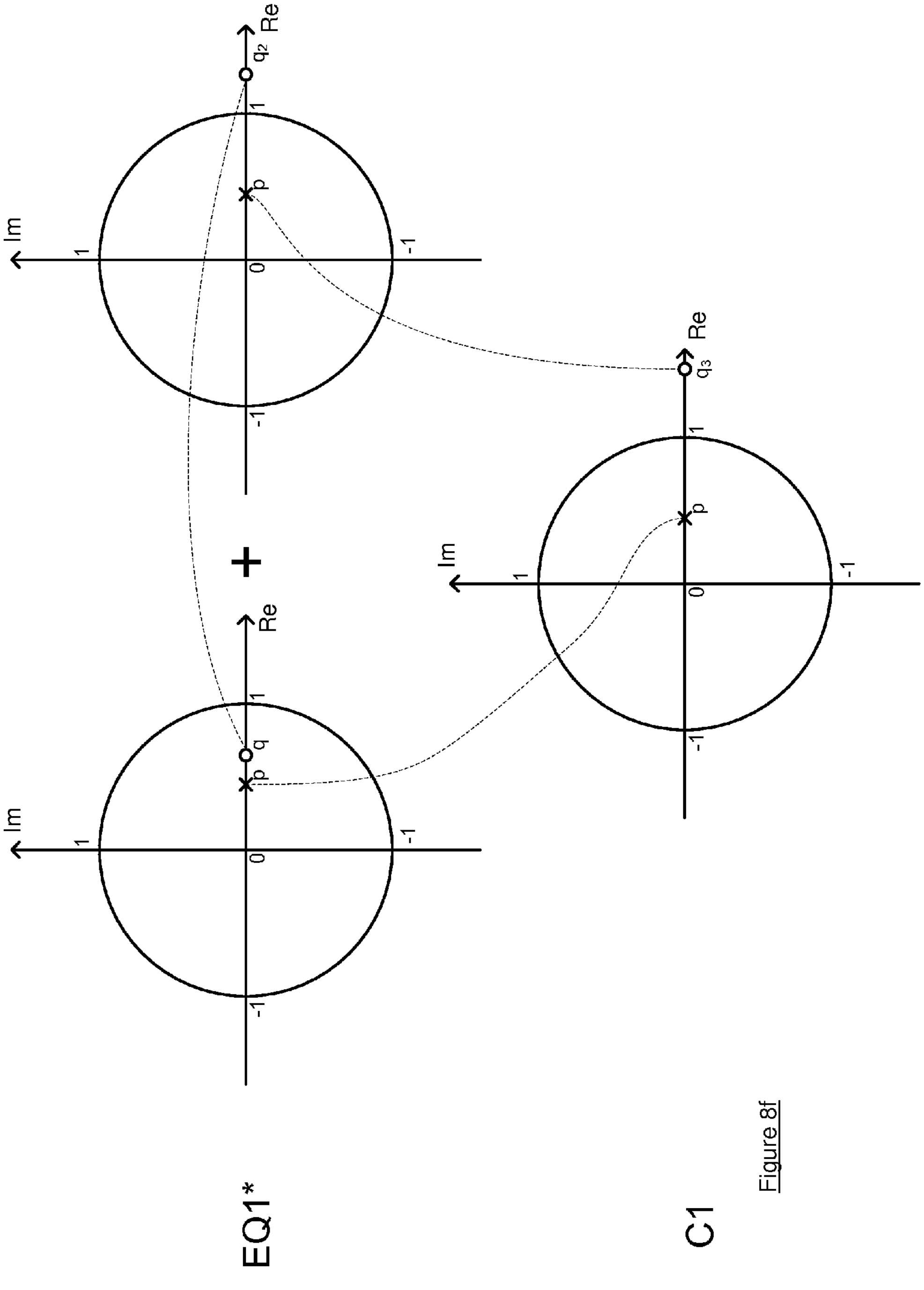

FIG. 8*f* illustrates the pole/zero diagrams of the modified target filter EQ1* of FIG. 8*c* together with the compensation filter C1. Considering the zeros of the two sections of the modified target filter EQ1*, the frequency-dependent phase response of the zero inside the unit circle (i.e. the zero at q) cancels the frequency-dependent phase response of the zero outside the unit circle (i.e. the zero at $q_2$), leaving only a constant delay of two samples. The pole of the first order section of the compensation filter C1 is the same as the pole of one of the first order sections of the modified target filter EQ1*, and so generates the same phase response as the pole of that first order section of the modified target filter EQ1*; the zero $q_3$ of the first order section of the compensation filter C1, being in the reciprocal position to the pole, generates the same phase response as the pole of the other first order section of the modified target filter EQ1*. Thus, both the equalization path (i.e. the use of the modified target filter EQ1*) and the compensation path (i.e. the use of the compensation filter C1) induce the same phase response. These relationships are shown in FIG. 8*f* by dashed lines.

Figure 8G:
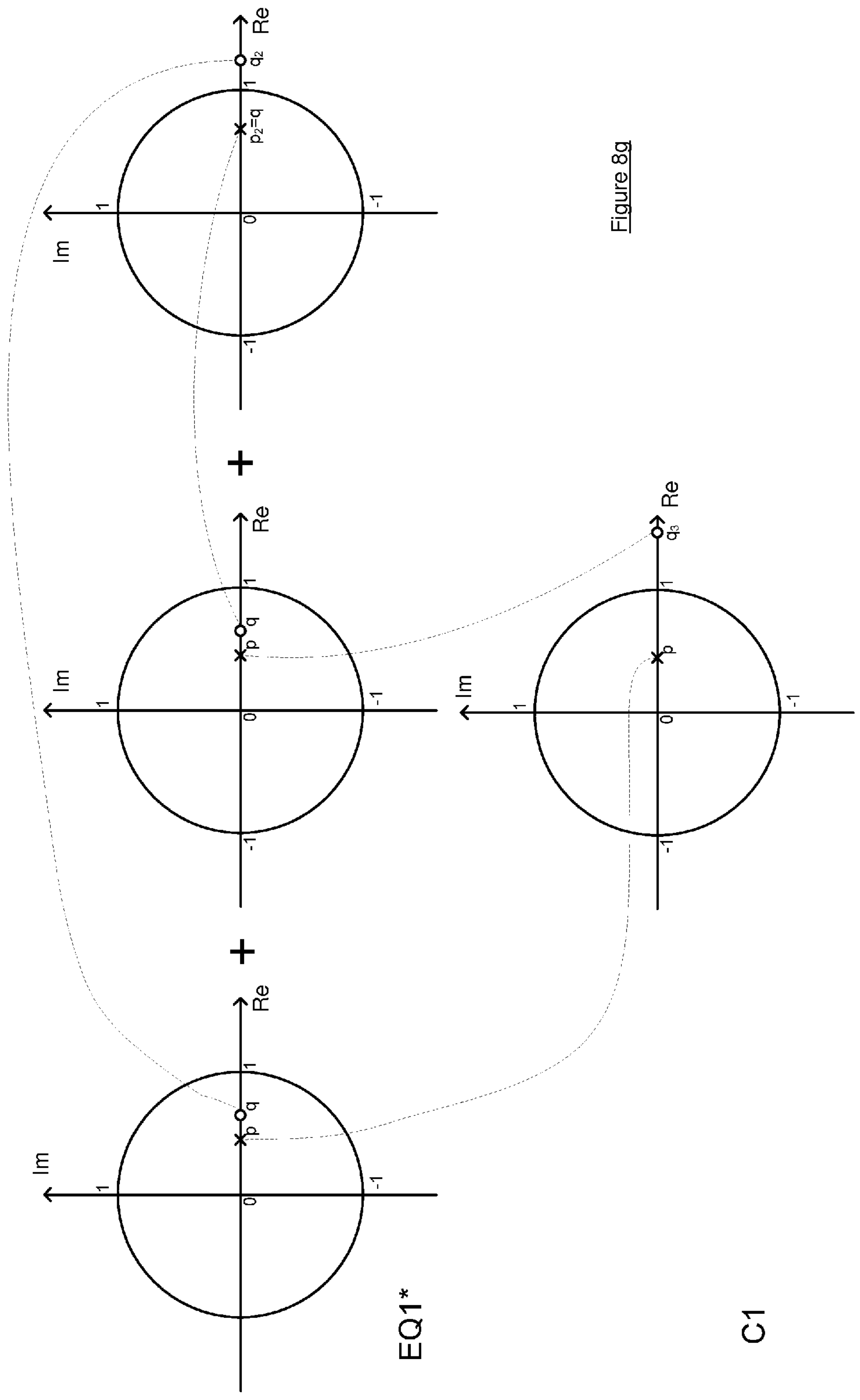

FIG. 8*g* illustrates the pole/zero diagrams of the modified target filter EQ1* of FIG. 8*d* together with the compensation filter C1. For the modified target filter EQ1*: the frequency-dependent phase response of one of the zeros inside the unit circle (i.e. one of the zeros at q) cancels the frequency-dependent phase response of the zero outside the unit circle (i.e. the zero at $q_2$); the frequency-dependent phase response of the other zero inside the unit circle (i.e. the other zero at q) cancels the frequency-dependent phase response of the pole $p_2$ that is also located at q. The pole of the first order section of the compensation filter C1 is the same as the pole p of the left first order section of the modified target filter EQ1*, and so generates the same phase response as the pole of that first order section of the modified target filter EQ1*; the zero $q_3$ of the first order section of the compensation filter C1, being in the reciprocal position to the pole, generates the same phase response as the pole p of the middle first order section of the modified target filter EQ1*. Thus, both the equalization path (i.e. the use of the modified target filter EQ1*) and the compensation path (i.e. the use of the compensation filter C1) induce the same phase response. These relationships are shown in FIG. 8*f* by dashed lines.

Again, a pole or a zero located at the origin has no effect on the signal (either in phase or amplitude) and can therefore be ignored—i.e. none of the above reciprocal calculations/modifications need be performed in respect of such a pole or zero of the target filter EQ1.

It will be appreciated that embodiments of the invention may be implemented using a variety of different information processing systems. In particular, although FIG. 1 and the discussion thereof provide an exemplary computing architecture, these are presented merely to provide a useful reference in discussing various aspects of the invention. Of course, the description of the architecture has been simplified for purposes of discussion, and it is just one of many different types of architecture that may be used for embodiments of the invention. It will be appreciated that the boundaries between logic blocks are merely illustrative and that alternative embodiments may merge logic blocks or elements, or may impose an alternate decomposition of functionality upon various logic blocks or elements.

It will be appreciated that, insofar as embodiments of the invention are implemented by a computer program, then a storage medium and a transmission medium carrying the computer program form aspects of the invention. The computer program may have one or more program instructions, or program code, which, when executed by a computer carries out an embodiment of the invention. The term "program," as used herein, may be a sequence of instructions designed for execution on a computer system, and may include a subroutine, a function, a procedure, an object method, an object implementation, an executable application, an applet, a servlet, source code, object code, a shared library, a dynamic linked library, and/or other sequences of instructions designed for execution on a computer system. The storage medium may be a magnetic disc (such as a hard drive or a floppy disc), an optical disc (such as a CD-ROM, a DVD-ROM or a BluRay disc), or a memory (such as a ROM, a RAM, EEPROM, EPROM, Flash memory or a portable/removable memory device), etc. The transmission medium may be a communications signal, a data broadcast, a communications link between two or more computers, etc.

The invention claimed is:

1. A method of processing an input audio signal by an apparatus comprising a processor coupled to an audio source and to one or more speakers arranged to output audio, the method comprising:

receiving, using the processor, the input audio signal from the audio source: forming, using the processor, a plurality of output audio signals from the input audio signal, wherein each output audio signal is formed by performing respective processing on the input audio signal, wherein for a first output audio signal there is a target audio equalization operation comprising a target filter twice; and outputting, using the processor, the plurality of output audio signals to drive one or more speakers, wherein for the first output audio signal, the respective processing comprises a first audio equalization operation, the first audio equalization operation being the target audio equalization operation modified to compensate for phase shifts that correspond to zeros of the transfer function of the target audio equalization operation;

wherein for each output audio signal other than the first output audio signal, the respective processing comprises a compensation filter that compensates for phase shifts that correspond to poles of the transfer function of the target audio equalization operation.

2. A method of determining a configuration for audio equalization of an input audio signal, wherein a plurality of output audio signals are to be formed from the input audio signal by performing respective processing on the input audio signal using an apparatus comprising a processor coupled to an audio source and to one or more speakers arranged to output audio based on the plurality of output signals, wherein for a first output audio signal there is a target audio equalization operation comprising a target filter twice, the method comprising: specifying the target audio equalization operation:

setting the respective processing for the first output audio signal to comprise a first audio equalization operation, the first audio equalization operation being the target audio equalization operation modified to compensate for phase shifts that correspond to zeros of the transfer function of the target audio equalization operation;

for each output audio signal other than the first output audio signal, setting the respective processing to comprise a compensation filter that compensates for phase shifts that correspond to poles of the transfer function of the target audio equalization operation, and outputting, using the processor, the plurality of output audio signals to drive one or more speakers.

3. The method of claim 2, in which the first audio equalization operation equals the target audio equalization operation but with one of the target filters replaced by a replacement filter, wherein:

(a) the poles of the transfer function of the replacement filter are the same as the poles of the transfer function of the target filter; and (b) the zeros of the transfer function of the replacement filter are reciprocals of the zeros of the transfer function the target filter.

4. The method of claim 2, in which the first audio equalization operation equals the target audio equalization operation together with an additional filter, wherein:

(a) the poles of the transfer function of the additional filter are the same as the zeros of the transfer function of the target filter; and (b) the zeros of the transfer function of the additional filter are reciprocals of the zeros of the transfer function the target filter.

5. The method of claim 2, in which:

(a) the poles of the transfer function of the compensation filter are the same as the poles of the transfer function of the target filter; and (b) the zeros of the transfer function of the compensation filter are reciprocals of the poles of the transfer function the target filter.

6. The method of claim 2 comprising time-aligning the plurality of output audio signals.

7. An apparatus comprising a processor, and a memory coupled to an audio source and to one or more speakers arranged to output audio, the processor configured to:

receive an input audio signal from the audio source:

form a plurality of output audio signals from the input audio signal, wherein each output audio signal is formed by performing respective processing on the input audio signal, wherein for a first output audio signal there is a target audio equalization operation comprising a target filter twice;

output the plurality of output audio signals to drive the one or more speakers, wherein for the first output audio signal, the respective processing comprises a first audio equalization operation, the first audio equalization operation being the target audio equalization operation modified to compensate for phase shifts that correspond to zeros of the transfer function of the target audio equalization operation;

wherein for each output audio signal other than the first output audio signal, the respective processing comprises a compensation filter that compensates for phase shifts that correspond to poles of the transfer function of the target audio equalization operation.

8. An apparatus comprising a first processor that is configured to determine a configuration for audio equalization of an input audio signal, wherein a plurality of output audio signals are to be formed from the input audio signal by performing respective processing on the input audio signal using a second processor coupled to an audio source and one or more speakers arranged to output audio based on the plurality of output audio signals, wherein for a first output audio signal there is a target audio equalization operation comprising a target filter twice, the first processor further configured to:

specify the target audio equalization operation;

set the respective processing for the first output audio signal to comprise a first audio equalization operation, the first audio equalization operation being the target audio equalization operation modified to compensate for phase shifts that correspond to zeros of the transfer function of the target audio equalization operation; for each output audio signal other than the first output audio signal, setting the respective processing to comprise a compensation filter that compensates for phase shifts that correspond to poles of the transfer function of the target audio equalization operation.

9. The method of claim 1, in which the first audio equalization operation equals the target audio equalization operation but with one of the target filters replaced by a replacement filter, wherein:

(a) the poles of the transfer function of the replacement filter are the same as the poles of the transfer function of the target filter; and (b) the zeros of the transfer function of the replacement filter are reciprocals of the zeros of the transfer function the target filter.

10. The method of claim 1, in which the first audio equalization operation equals the target audio equalization operation together with an additional filter, wherein:

(a) the poles of the transfer function of the additional filter are the same as the zeros of the transfer function of the target filter; and (b) the zeros of the transfer function of the additional filter are reciprocals of the zeros of the transfer function the target filter.

11. The method of claim 1, in which:

(a) the poles of the transfer function of the compensation filter are the same as the poles of the transfer function of the target filter; and (b) the zeros of the transfer function of the compensation filter are reciprocals of the poles of the transfer function the target filter.

12. The method of claim 1 comprising time-aligning the plurality of output audio signals.

13. The apparatus of claim 8 wherein the first processor and the second processor are the same entity.

* * * * *